United States Patent
Nakatani et al.

(10) Patent No.: US 7,312,677 B2
(45) Date of Patent: Dec. 25, 2007

(54) MICRO-SWITCHING ELEMENT FABRICATION METHOD AND MICRO-SWITCHING ELEMENT

(75) Inventors: Tadashi Nakatani, Kawasaki (JP); Tsutomu Miyashita, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/878,330

(22) Filed: Jun. 29, 2004

(65) Prior Publication Data

US 2005/0190023 A1     Sep. 1, 2005

(30) Foreign Application Priority Data

Feb. 27, 2004   (JP) .............................. 2004-055180

(51) Int. Cl.
*H01H 51/22* (2006.01)
(52) U.S. Cl. ........................................ 335/78; 200/181
(58) Field of Classification Search ................. 335/78; 200/181
See application file for complete search history.

(56) References Cited

U.S. PATENT DOCUMENTS

| | | | |
|---|---|---|---|
| 5,578,976 A | | 11/1996 | Yao |
| 6,307,452 B1 * | | 10/2001 | Sun .............................. 333/262 |
| 6,483,395 B2 * | | 11/2002 | Kasai et al. ................. 333/105 |
| 6,529,093 B2 * | | 3/2003 | Ma .............................. 333/101 |
| 6,657,525 B1 * | | 12/2003 | Dickens et al. ................ 335/78 |
| 2003/0146079 A1 * | | 8/2003 | Goldsmith ................... 200/181 |
| 2004/0188783 A1 * | | 9/2004 | Funaki ........................ 257/415 |

FOREIGN PATENT DOCUMENTS

| EP | 1146533 A1 | 10/2001 |
|---|---|---|
| JP | 9-17300 | 1/1997 |
| JP | 2000-188050 | 7/2000 |

* cited by examiner

*Primary Examiner*—Lincoln Donovan
*Assistant Examiner*—Bernard Rojas
(74) *Attorney, Agent, or Firm*—Kratz, Quintos & Hanson, LLP

(57) ABSTRACT

A method is provided for making a micro-switching element. The switching element includes a substrate, two supporting members fixed to the substrate, and a movable beam bridging between the supporting members. The beam includes a membrane, a movable contact electrode and a movable driving electrode, both disposed on the membrane. The switching element also includes a pair of stationary contact electrodes facing the movable contact electrode, and a stationary driving electrode cooperating with the movable driving electrode for generation of electrostatic force. The method includes the steps of making a sacrifice layer on the substrate, making the membrane on the sacrifice layer, and subjecting the sacrifice layer to etching with the membrane intervening, so that the supporting members are formed as remaining portions of the sacrifice layer between the substrate and the membrane.

6 Claims, 24 Drawing Sheets

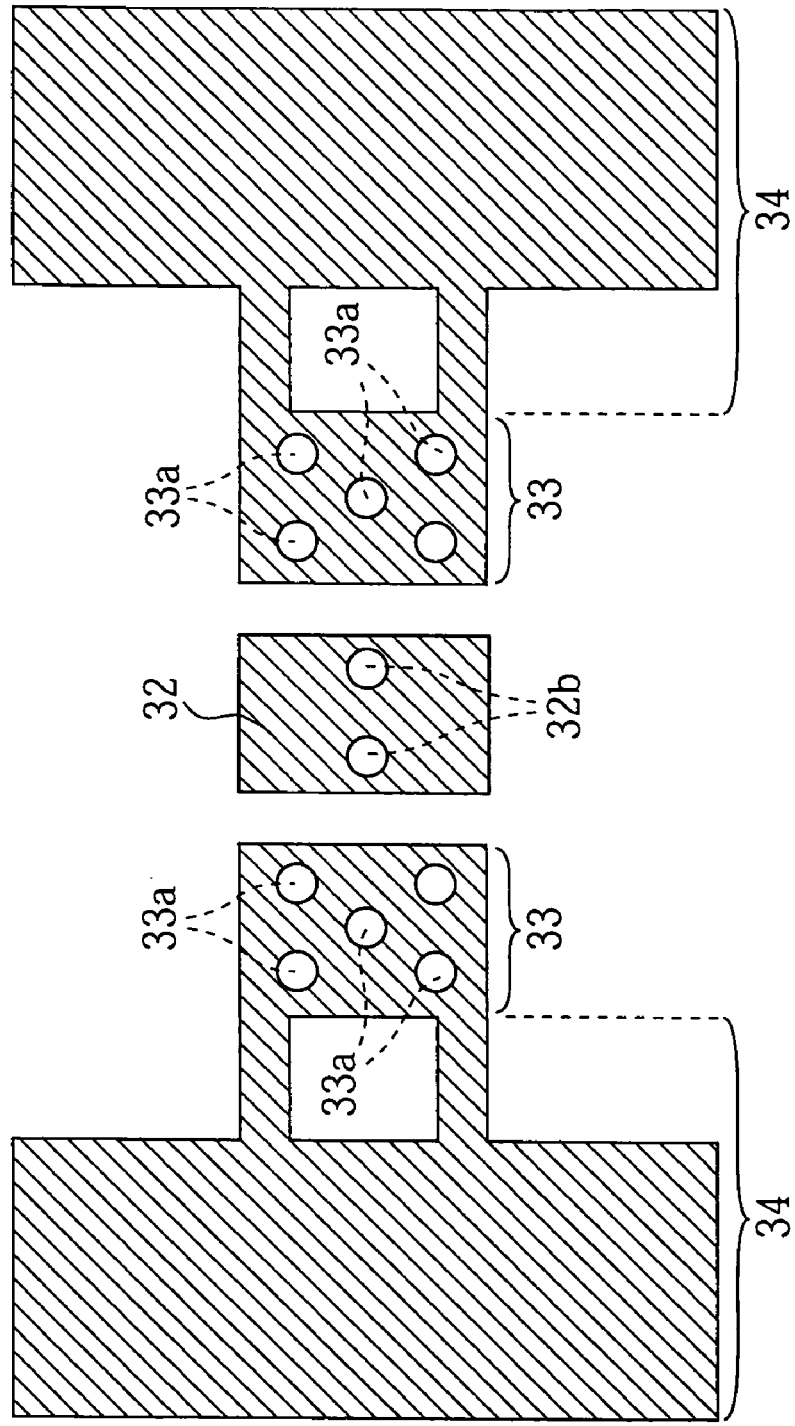

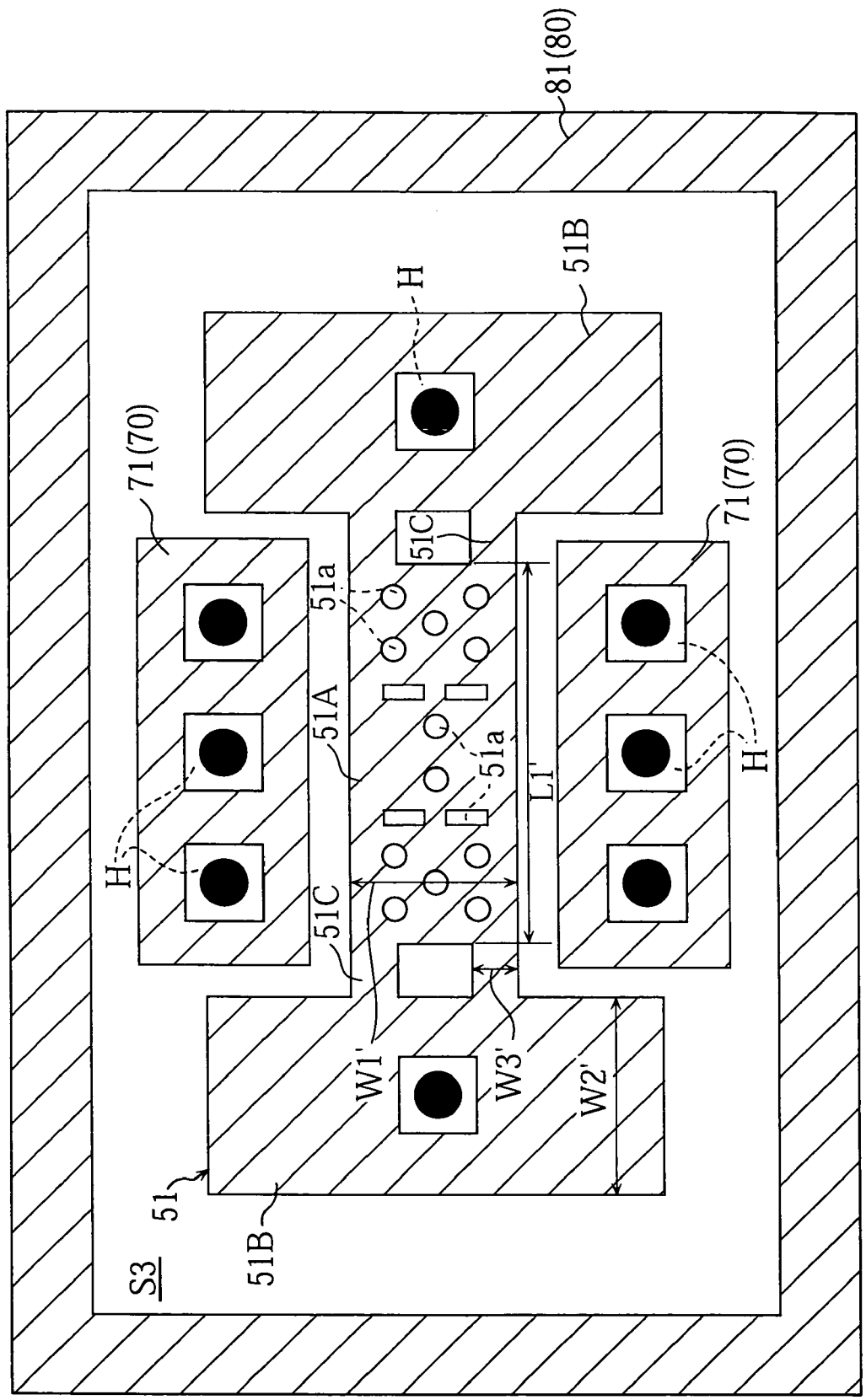

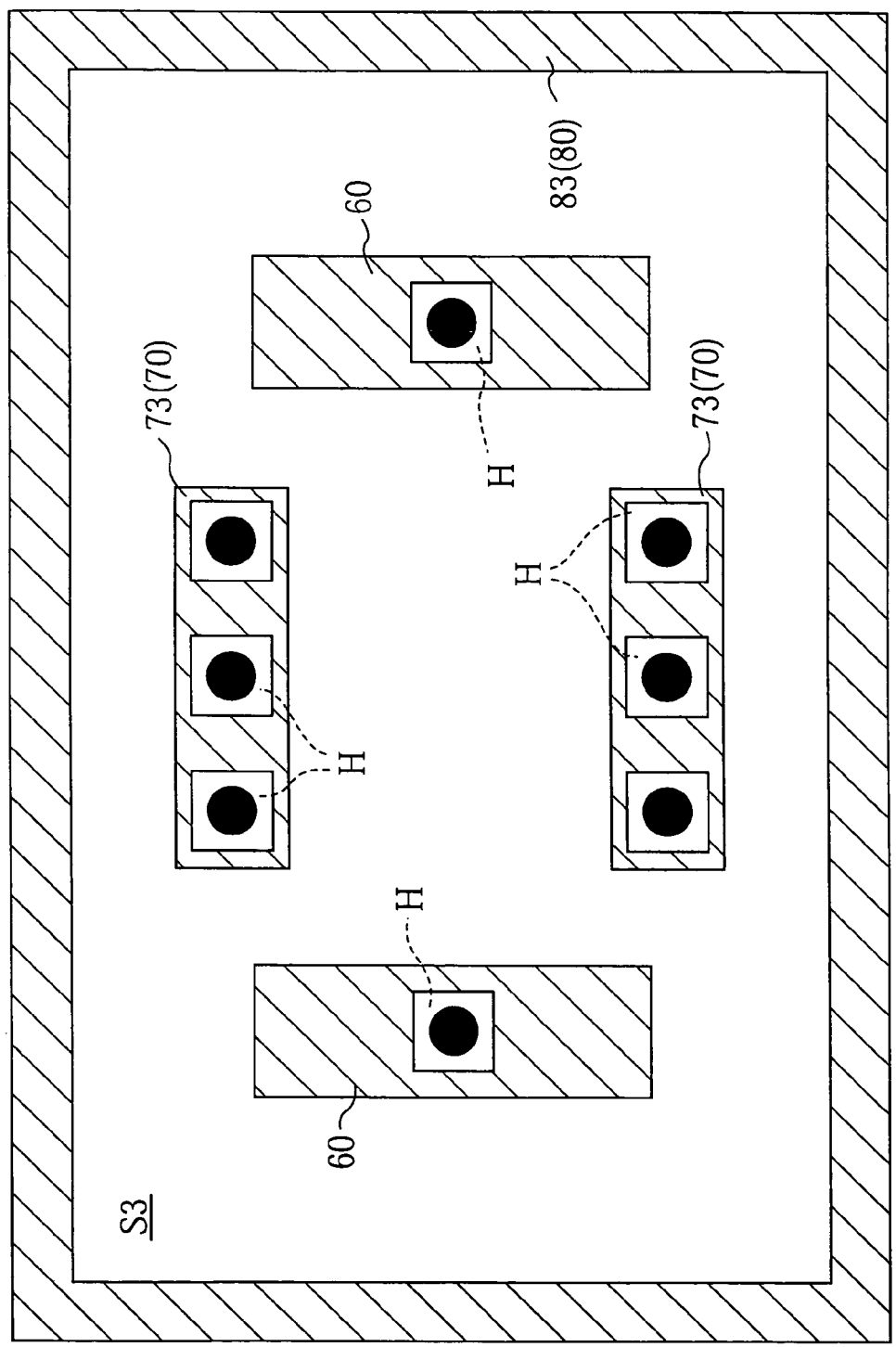

MICRO-SWITCHING ELEMENT FABRICATION METHOD AND MICRO-SWITCHING ELEMENT

BACKGROUND OF THE INVENTION

1. Field of the Invention

The present invention relates to a micro-switching element fabrication method that utilizes MEMS technology. The present invention also relates to a micro-switching element produced by such a method.

2. Description of the Related Art

In the technical field of wireless communications devices such as mobile telephones, an increasing number of parts are required for providing high-quality products. At the same time, the product should be small enough so that the user can carry it easily. To make such a compact wireless communications device, high-frequency circuits or RF circuits should be made small. To meet this requirement, MEMS technology is adopted for making infinitesimal components that constitute a required circuit.

An example of such infinitesimal components is an MEMS switch. Typically, an MEMS switch includes a pair of contact electrodes and a pair of driving electrodes. The contact electrodes are opened and closed mechanically for implementing the switching function. The driving electrodes are provided for realizing the switching operation of the contact electrodes by electrostatic force. For high-frequency switching operation (e.g., on GHz order), an MEMS switch is more advantageous than a conventional PIN diode switch or MESFET switch, since the MEMS switch can provide better electrical insulation in the open circuit state and suffer lower insertion loss. Conventional MEMS switches are disclosed in JP-A-09-173000 and JP-A-2000-188050, for example.

FIGS. 20 and 21 show a conventional MEMS micro-switching element X3. FIG. 20 is a plan view showing the principal portions of the switching element X3, while FIG. 21 is a sectional view taken along lines XXI-XXI in FIG. 20. The switching element X3 includes a substrate 301, a pair of contact electrodes 302, two driving electrodes 303, a movable member 304 and reinforcing plating layers 305. The contact electrodes 302 are formed on the substrate 301 and spaced from each other. The two driving electrodes 303 are formed on the substrate 301 in a symmetrical manner with respect to the contact electrodes 302. The movable member 304 extends over the contact electrodes 302 and the driving electrodes 303 on the substrate 301. The movable member 304 as a whole may be made of an electroconductive material. As shown in FIG. 21, the movable member 304 is formed with a contact electrode portion 304a and two driving electrode portions 304b. The contact electrode portion 304a is arranged to face the inner ends of the respective contact electrodes 302 (see also FIG. 20), while each driving electrode portion 304b is arranged to face a corresponding one of the driving electrodes 303. The plating layer 305 is provided for reinforcing the connection between the movable member 304 and the substrate 301. Though not shown in the figures, a wiring pattern is formed on the substrate 301 to be connected to the contact electrodes 302, the driving electrodes 303 or the movable member 304. In the switching element X3, the movable member 304 is resilient and can be deformed downward when electrostatic attraction is generated between the driving electrodes 303 and the driving electrode portions 304b. The movable member 304 is deformed until the contact electrode portions 304a come into contact with the contact electrodes 302.

FIGS. 22A–22D and FIGS. 23A–23D show some steps of a process for making the above-described switching element X3. First, as shown in FIG. 22A, driving electrodes 303 are formed on a substrate 301 by patterning. Then, as shown in FIG. 22B, contact electrodes 302 are formed between the driving electrodes 303 by pattering. As shown in FIG. 22C, a sacrifice layer 306 is formed on the substrate 301 by depositing an appropriate material. As shown in FIG. 22D, the sacrifice layer 306 is patterned into a predetermined configuration by etching, for example. Then, as shown in FIG. 23A, a layer 304' is formed to cover the sacrifice layer 306 and the substrate 301. As shown in FIG. 23B, the layer 304' is formed into a movable member 304 by patterning. As shown in FIG. 23C, a reinforcing plating layer 305 is formed on each end of the movable member 304. Then, as shown in FIG. 23D, the sacrifice layer 306 is etched away to provide a space between the substrate 301 and the movable member 304.

In the process for making the micro-switching element X3, the patterning of the sacrifice layer 306 need be performed, as described above with reference to FIG. 22D. In addition, as described above with reference to FIG. 23C, the reinforcing plating layers 305 need be formed on the respective ends of the movable member 304. Unfavorably, the sacrifice layer patterning step and the reinforcing layer forming step lower the yield of the switching elements X3.

FIGS. 24 and 25 show another conventional MEMS micro-switching element-switching element X4. FIG. 24 is a plan view showing the principal portions of the switching element X4, while FIG. 25 is a sectional view taken along lines XXV-XXV in FIG. 24. The switching element X4 includes a substrate 401, a pair of contact electrodes 402, two driving electrodes 403, a pair of supporting members 404 and a movable beam 405. The paired contact electrodes 402 are formed on the substrate 401 and spaced from each other. The two driving electrodes 403 are formed on the substrate 401 in a symmetrical manner with respect to the contact electrodes 402. The two supporting members 404 are mounted on the substrate 401 in a symmetrical manner with respect to these electrodes. The movable beam 405 bridges between the supporting members 404, to extend over the contact electrodes 402 and the driving electrodes 403. The supporting members 404 are made of an insulating material, while the movable beam 405 as a whole may be made of an electroconductive material. The movable beam 405 is formed with a contact electrode portion 405a and two driving electrode portions 405b. The contact electrode portion 405a is arranged to face the inner ends of the respective contact electrodes 402, while each driving electrode portion 405b is arranged to face a corresponding one of the driving electrodes 403. Though not shown in the figures, a wiring pattern is formed on the substrate 401 to be connected to the contact electrodes 402, the driving electrodes 403 and the movable beam 405. In the micro-switching element X4, the movable beam 405 is resilient and can be deformed downward when an electrostatic force is generated between the driving electrodes 403 and the driving electrode portions 405b, so that the contact electrode portions 405a come into contact with the contact electrodes 402.

FIGS. 26A-26D and FIGS. 27A-27D show some steps of a process for making the above-described switching element X4. First, as shown in FIG. 26A, contact electrodes 402 and driving electrodes 403 are formed on a substrate 401 by patterning. Then, as shown in FIG. 26B, a pair of supporting members 404 is formed by depositing an appropriate material on the substrate 401 and patterning the resultant material layer. As shown in FIG. 26C, a layer 406' is formed to cover the contact electrodes 402, the driving electrodes 403 and the supporting members 404 by depositing an appropriate material on the substrate 401. As shown in FIG. 26D, the surface of the layer 406' is ground until the top surfaces of the respective supporting members 404 are exposed. Thus, a sacrifice layer 406 is obtained, which has the same thickness as the supporting members 404. Then, as shown in FIG. 27A, the sacrifice layer 406 is subjected to etching to be provided with a predetermined surface configuration. As shown in FIG. 27B, a conductive layer 405' is formed on the sacrifice layer 406. As shown in FIG. 27C, the layer 405' is patterned into a movable beam 405. Then, as shown in FIG. 27D, the sacrifice layer 406 is etched away to provide a space between the substrate 401 and the movable beam 405.

In the process for making the switching element X4, the paired supporting members 404 need be formed on the substrate 401 by patterning, as described above with reference to FIG. 26B. In addition, as described above with reference to FIG. 26D, the material layer 406' need be ground to provide a sacrifice layer 406 having the predetermined thickness. Unfavorably, these steps lower the yield of the switching elements X4.

SUMMARY OF THE INVENTION

The present invention has been proposed under the circumstances described above. It is, therefore, an object of the present invention to provide a method by which micro-switching elements are produced with a high yield. Another object of the present invention is to provide a micro-switching element produced by such a method.

According to a first aspect of the present invention, there is provided a method of making a micro-switching element which comprises: a first substrate; a pair of supporting members spaced from each other and fixed to the substrate; a movable beam that includes a membrane bridging between the supporting members, a movable contact electrode disposed on the membrane and a movable driving electrode disposed on the membrane; a pair of stationary contact electrodes arranged to face the movable contact electrode; and a stationary driving electrode cooperating with the movable driving electrode for generation of electrostatic force. The method comprises: a sacrifice layer forming step for making a sacrifice layer on the substrate; a membrane forming step for making the membrane on the sacrifice layer; and a supporting member forming step for subjecting the sacrifice layer to etching with the membrane intervening, so that the supporting members are formed as remaining portions of the sacrifice layer between the substrate and the membrane.

The method of the present invention may further comprise: a first additional step performed before the sacrifice layer forming step; and a second additional step performed after the membrane forming step but before the supporting member forming step. The first additional step is performed for forming the stationary driving electrode and the stationary contact electrodes on the substrate, while the second additional step is performed for forming the movable contact electrode and the movable driving electrode on the membrane. In the membrane forming step, an opening corresponding in position to the stationary contact electrodes is formed in the membrane. The movable contact electrode includes a portion extending through the opening to face the relevant one of the stationary contact electrodes.

The method of the present invention may further comprise the steps of: forming the stationary driving electrode and the stationary contact electrodes on a second substrate; and combining the first substrate and the second substrate via a bonding wall in a manner such that the movable contact electrode faces the stationary contact electrodes, and that the movable driving electrode faces the stationary driving electrode.

Preferably, the first substrate, the second substrate and the bonding wall separate the movable contact electrode, the stationary contact electrodes, the movable driving electrode and the stationary driving electrode from the exterior of the micro-switching element.

Preferably, the sacrifice layer is made of silicon, while the membrane is made of silicon dioxide or silicon nitride. Alternatively, the sacrifice layer may be made of silicon dioxide, while the membrane may be made of silicon.

Preferably, the membrane may have a thickness no smaller than 1.5 μm.

According to a second aspect of the present invention, there is provided a micro-switching element comprising: a substrate; a pair of supporting members spaced from each other and fixed to the substrate; a movable beam that includes a membrane bridging between the supporting members, a movable contact electrode on the membrane and a movable driving electrode on the membrane; a pair of stationary contact electrodes formed on the substrate and arranged to face the movable contact electrode; and a stationary driving electrode formed on the substrate and cooperating with the movable driving electrode for generation of electrostatic force. The supporting members are formed as remaining portions of the sacrifice layer by removing part of the sacrifice layer disposed between the substrate and the membrane.

According to a third aspect of the present invention, there is provided a micro-switching element comprising: a first substrate and a second substrate facing the first substrate; a pair of supporting members spaced from each other and fixed to the first substrate; a movable beam that includes a membrane bridging between the supporting members, a movable contact electrode on the membrane and a movable driving electrode on the membrane, the beam being disposed between the first substrate and the second substrate; a pair of stationary contact electrodes formed on the second substrate and arranged to face the movable contact electrode; a stationary driving electrode formed on the second substrate and cooperating with the movable driving electrode for generation of electrostatic force; and a bonding wall disposed between the first substrate and the second substrate. The first substrate, the second substrate and the bonding wall separate the movable contact electrode, the stationary contact electrodes, the movable driving electrode and the stationary driving electrode from the exterior of the micro-switching element.

Preferably, the supporting members may be formed as remaining portions of the sacrifice layer by removing part of the sacrifice layer disposed between the first substrate and the movable beam.

Other features and advantages of the present invention will become apparent from the detailed description given below with reference to the accompanying drawings.

BRIEF DESCRIPTION OF THE DRAWINGS

FIG. 5 is a plan view showing a movable contact electrode, movable driving electrodes and wiring portions of the switching element;

FIG. 15 is a sectional view taken along lines XV-XV in FIG. 10;

FIG. 16 is a sectional view taken along lines XVI-XVI in FIG. 10;

DETAILED DESCRIPTION OF THE PREFERRED EMBODIMENTS

Preferred embodiments of the present invention will be described below with reference to the accompanying drawings.

Figure 1:
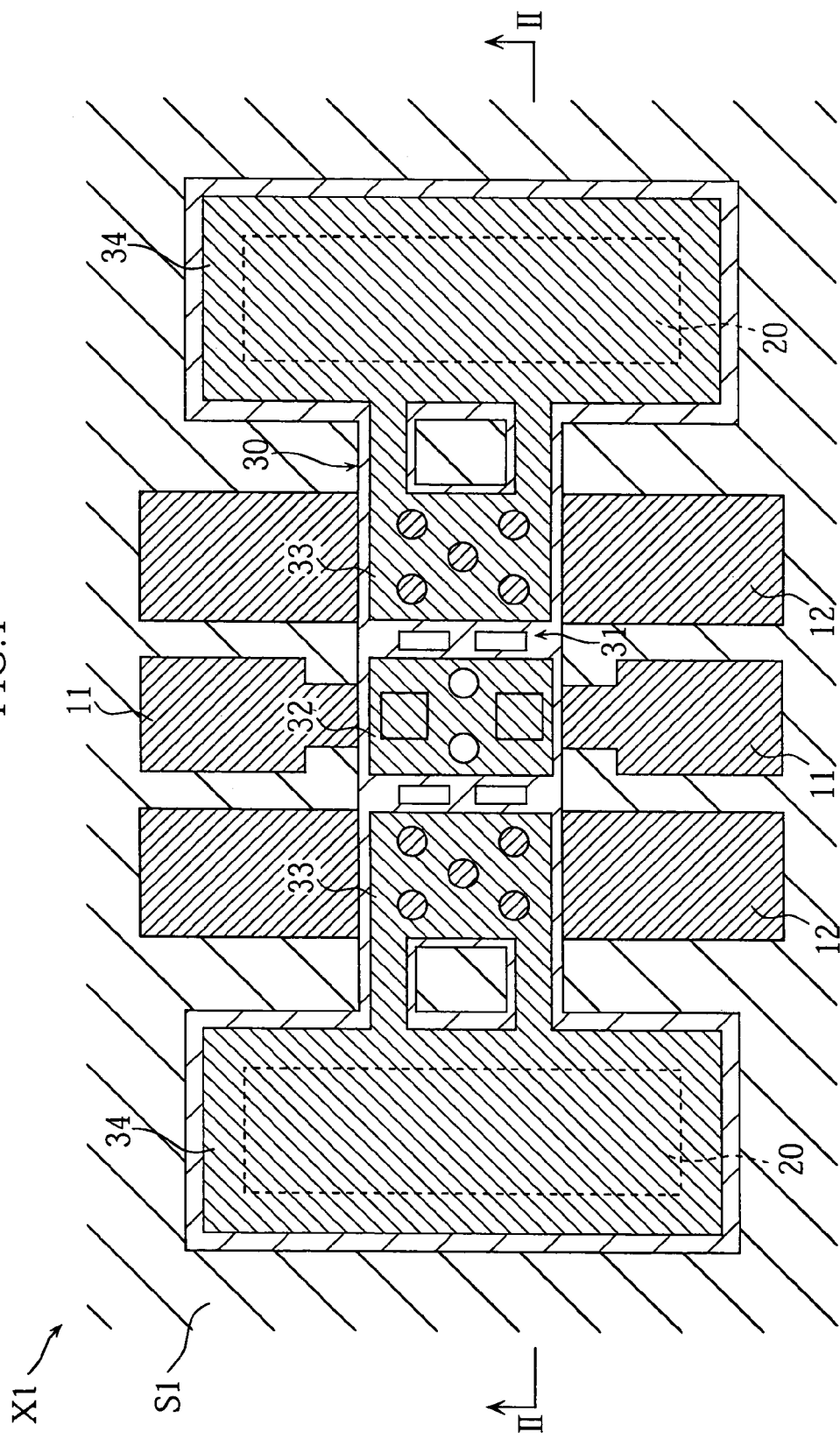
FIG. 1 is a plan view showing principal portions of a micro-switching element according to a first embodiment of the present invention.
Figure 2:
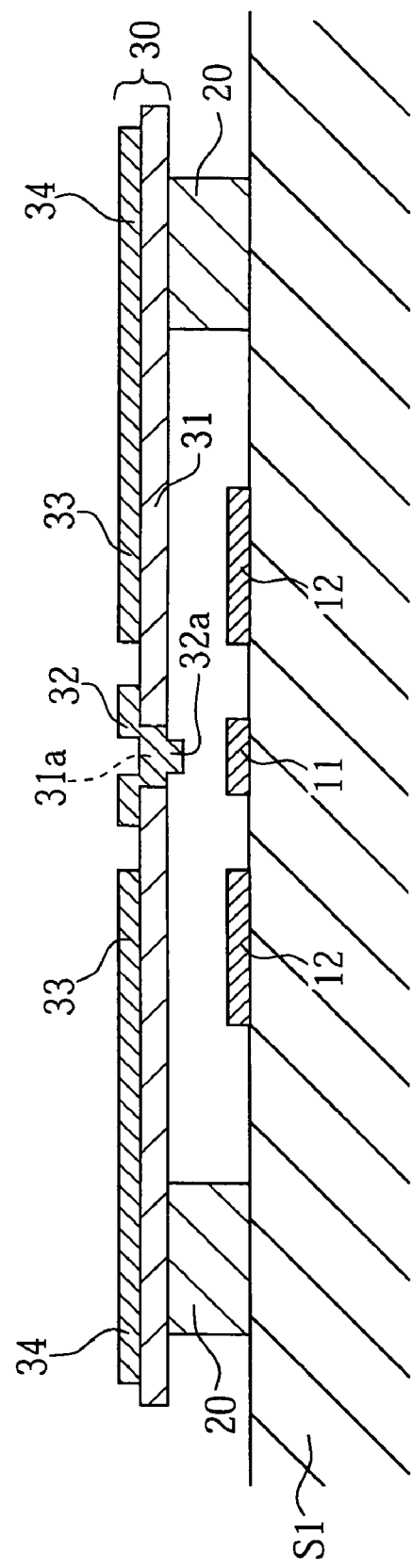
FIG. 2 is a sectional view taken along lines II-II in FIG. 1.

FIGS. 1 and 2 show a micro-switching element X1 according to a first embodiment of the present invention. FIG. 1 is a plan view showing the principal portions of the switching element X1, while FIG. 2 is a sectional view taken along lines II-II in FIG. 1. The illustrated switching element X1 includes a substrate S1, a pair of supporting members 20 and a movable beam 30.

Figure 3:
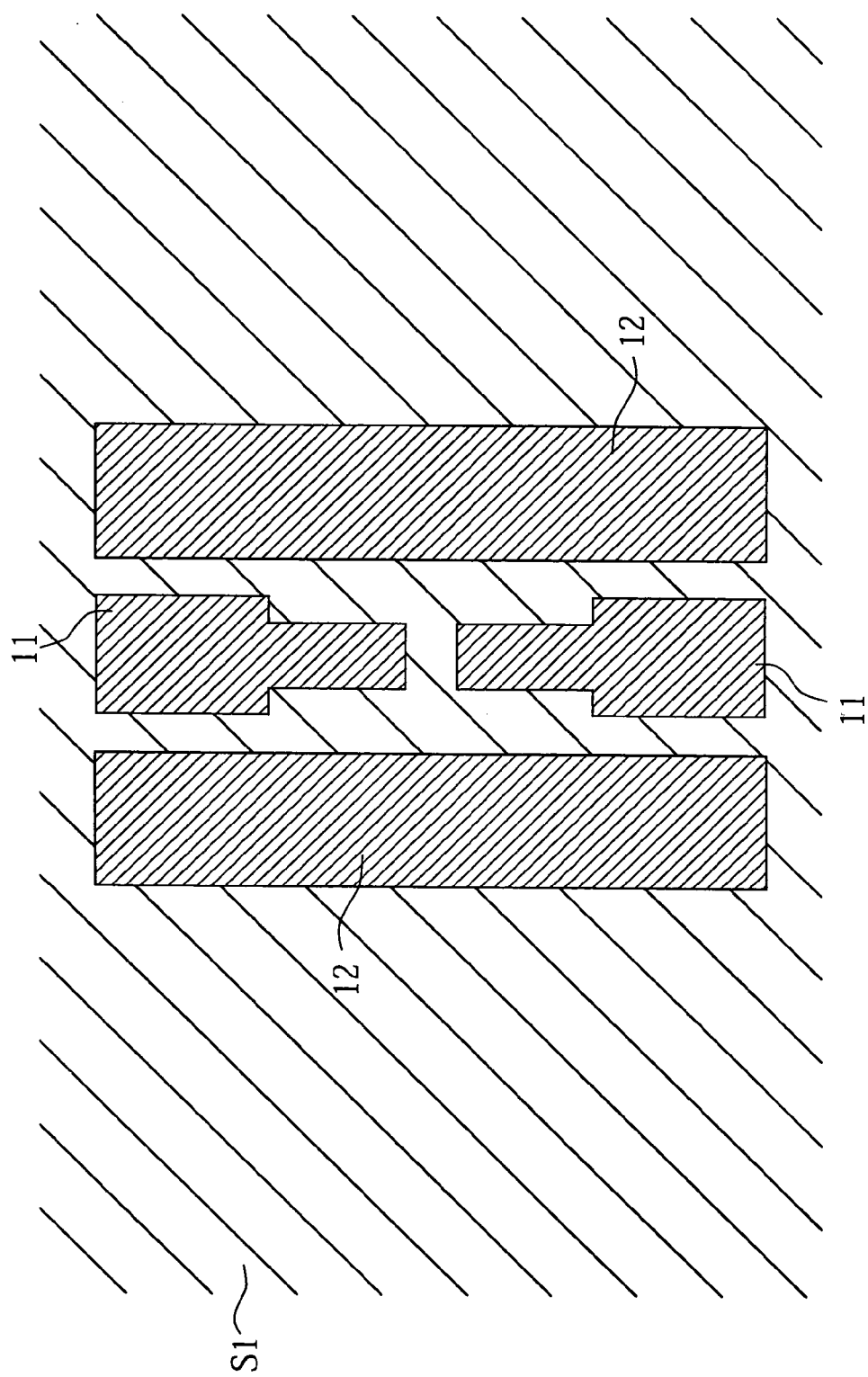
FIG. 3 is a plan view showing stationary contact electrodes and stationary driving electrodes of the switching element.
Figure 4:
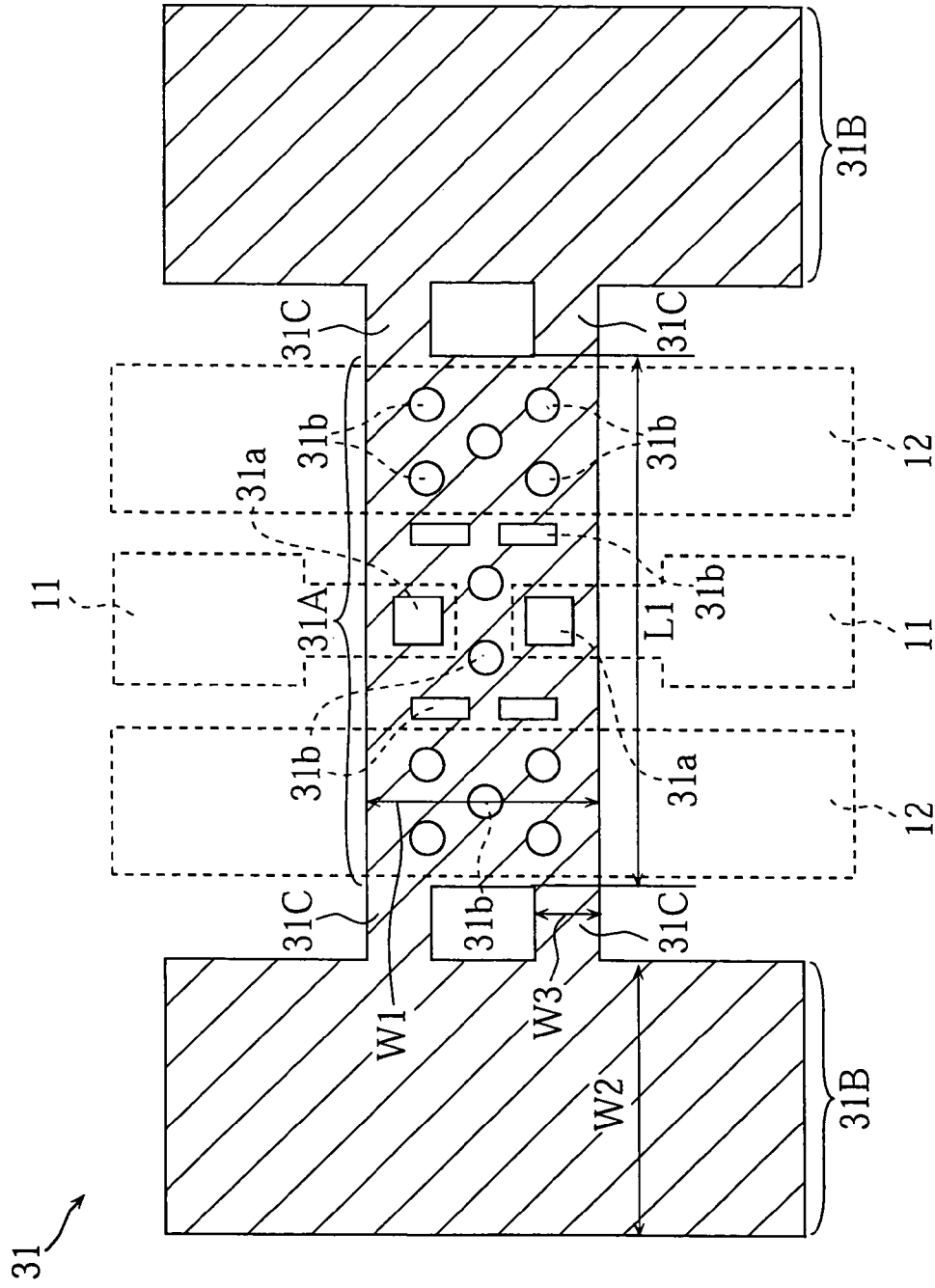
FIG. 4 is a plan view showing a membrane of the switching element.

The substrate S1 has an upper surface to which a pair of contact electrodes 11 and two driving electrodes 12 are fixed. The stationary contact electrodes 11 are spaced from each other. The stationary driving electrodes 12 are arranged to flank the contact electrodes 11 in a symmetrical manner with respect to the electrodes 11. FIG. 3 is a plan view showing the arrangement of the electrodes 11 and 12 on the substrate S1. The contact electrodes 11 are connected in series to a circuit via non-illustrated wiring, while the driving electrodes 12 are grounded via non-illustrated wiring. The paired supporting members 20 are arranged symmetrically with respect to these electrodes. As viewed vertically (see FIG. 2), the supporting members 20 are disposed between the substrate S1 and the movable beam 30. The movable beam 30 includes a membrane 31, a movable contact electrode 32, two movable driving electrodes 33 and two wiring portions 34. FIG. 4 shows the configuration of the membrane 31, while FIG. 5 shows the arrangement of the movable contact electrodes 32, the two driving electrodes 33 and the two wiring portions 34.

As shown in FIG. 4, the membrane 31 of the movable beam 30 includes a main portion 31A, a pair of end portions 31B, and four connecting portions 31C that connect the end portions 31B to the main portion 31A. The main portion 31A is formed with a pair of openings 31a and a plurality of openings 31b. Each of the openings 31a corresponds in position to the inner end of one of the stationary contact electrodes 11 and may be in the form of a square whose side has a length of 20 µm, for example. On the other hand, the openings 31b may be in the form of a circle having a diameter of 5 µm, for example. The present invention, however, is not limited to these. For instance, the openings 31b may include one or more rectangular openings. The main portion 31A has a length L1 and a width W1, where the length may be in a range of 150-300 µm, and the width in a range of 100-250 µm. Preferably, the thickness of the membrane may be no smaller than 1.5 µm and the quotient W1/L1 may be no smaller than 0.4 for preventing the membrane 31 (hence the beam 30) from deforming improperly. The end portions 31B come into direct contact with the supporting members 20. Each end portion 31B has a width W2 which may be in a range of 100-200 µm. Each connecting portion 31C has a width W3 which may be in a range of 5-30 µm. Since the main portion 31A is connected to the end portions 31B via the narrow connecting portions 31C, the membrane 31 (hence the beam 30) exhibits appropriate resilience. According to the present invention, the width W2 of the end portion 31B is greater than any one of the three dimensions as follows: (1) the distance between an edge of the main portion 31A and an opening 31b closest to the edge (the distance may be in a range of 10-30 µm, for example), (2) the formation pitch for the openings 31b (the pitch may be in a range of 10-30 µm, for example), and (3) the width W3.

The movable contact electrode 32, formed on the membrane 31, corresponds in position to the inner ends of the respective stationary contact electrodes 11 (see FIG. 1). The electrode 32 is formed with a pair of downward projections 32a. As shown in FIG. 2, each of the projections 32a extends through one of the openings 31a of the membrane 31 to face one of the stationary contact electrodes 11. The movable contact electrode 32 is formed with openings 32b (see FIG. 5) that communicate with the relevant ones of the openings 31b in the membrane 31.

Each of the movable driving electrodes 33, formed on the membrane 31, corresponds in position to one of the stationary driving electrodes 12 (see FIG. 1, for example). Each electrode 33 is formed with a plurality of openings 33*a* (see FIG. 5) that communicate with the relevant ones of the openings 31*b* in the membrane 31.

Each of the wiring portions 34 is formed on the end portion 31B and the connecting portions 31C of the membrane 31, covering most part of the end portion and most part of the connecting portion 31C, as shown in FIG. 1. Each wiring portion 34 and the adjacent movable driving electrode 33 are formed integral with each other. The two wiring portions 34 are connected to each other via non-illustrated wiring. Accordingly, the two movable driving electrodes 33 are also connected to each other. Each wiring portion 34 is formed with a conductive bump (not shown) for power supply. Alternatively, each wiring portion 34 may be connected to a power-supply wire, for example.

The micro-switching element X1 with the above-described arrangements operates in the following manner. First, a predetermined electric potential is given to the movable driving electrodes 33 via the wiring portions 34. This generates electrostatic attraction between each of the movable driving electrodes 33 and the relevant one of the stationary driving electrodes 12. As a result, the movable beam 30 is deformed downwardly until each of the projections 32*a* of the movable contact electrode 32 (see FIG. 2) comes into contact with the relevant one of the stationary contact electrodes 11. In this state, the two physically spaced stationary contact electrodes 11 are electrically connected to each other via the movable contact electrode 32, which permits an electrical current to flow through the closed circuit.

When the electrostatic attraction between the electrode 33 and the electrode 12 is eliminated, the movable beam 30 is restored to the original non-deforming state, detaching the projections 32*a* of the movable contact electrode 32 from the stationary contact electrode 11. This results in the open state of the switching element X1, as shown in FIG. 2. In the open state, the two stationary contact electrodes 11 are electrically separated from each other, whereby no electric current will pass through them.

Reference is now made to FIGS. 6A-6D and 7A-7C showing, in section, a process for making the above-described switching element X1. Each of the sectional views is taken along the lines II-II in FIG. 1.

Figure 6A:
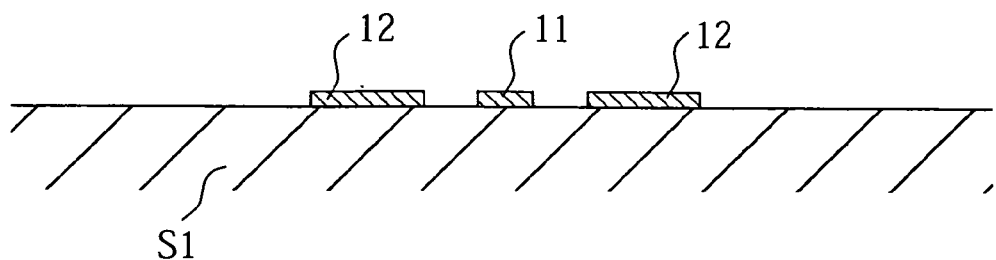
FIGS. 6A-6D show some steps of a method of making the switching element shown in FIG. 1.

First, as shown in FIG. 6A, stationary contact electrodes 11 and stationary driving electrodes 12 are formed on an insulating substrate S1. The substrate S1 may be a high-resistance silicon or glass plate coated with silicon dioxide film having a thickness of e.g. 1 μm. The specific manner of making the electrodes 11 and 12 is as follows. First, a Cr(chromium)-layer and a Au(gcld)-layer stacked on the Cr-layer are made on the substrate S1 by sputtering, for example. The resultant Cr-layer may have a thickness of e.g., 50 nm, while the Au-layer may have a thickness of e.g., 300 nm. Then, a resist pattern is formed on the Au-layer by photolithography. With the obtained resist pattern used as a mask, the Au- and Cr-layers are subjected to etching. Thus, the contact electrodes 11 and the driving electrode 12 as shown in FIG. 3 are obtained.

Figure 6B:
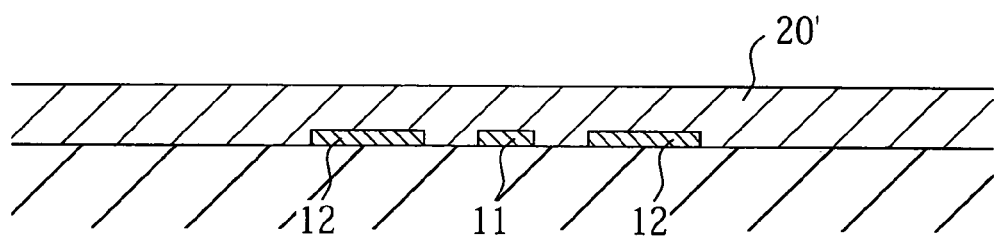

Then, as shown in FIG. 6B, a sacrifice layer 20' covering the electrodes 11, 12 is formed on the substrate S1 by sputtering, for example. The resultant sacrifice layer 20' may have a thickness of 1-3 μm. The sacrifice layer 20' may be made of a material such as silicon or silicon oxide. Preferably, an undoped material is used for making the sacrifice layer 20'.

Figure 6C:
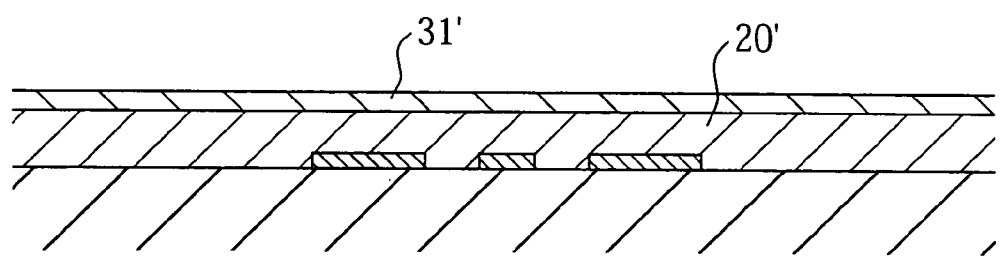

Then, as shown in FIG. 6C, a material layer 31' is formed on the sacrifice layer 20' by plasma CVD, for example. The thickness of the resultant layer 31' may be in a range of 1.5-3 μm. The material for making the layer 31' need be different from the material for making the sacrifice layer 20' so that the etching rates of these materials (the rates observed when the sacrifice layer 20' is subjected to etching at a latter stage to be described below) are different. When the sacrifice layer 20' is made of silicon, for instance, the layer 31' may preferably be made of silicon dioxide or silicon nitride. When the sacrifice layer 20' is made of silicon dioxide, the layer 31' may preferably be made of silicon.

Figure 6D:
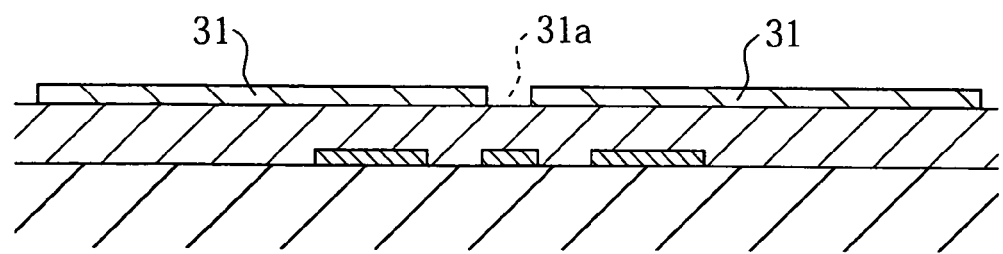

Then, as shown in FIG. 6D, the material layer 31' is formed into a membrane 31 (see FIG. 4) by patterning. Specifically, a resist pattern is formed on the material layer 31' by photolithography. With the resist pattern used as a mask, the material layer 31' is subjected to etching. Thus, the desired membrane 31 (with the openings 31*a*, 31*b* formed therein) is obtained.

Figure 7A:
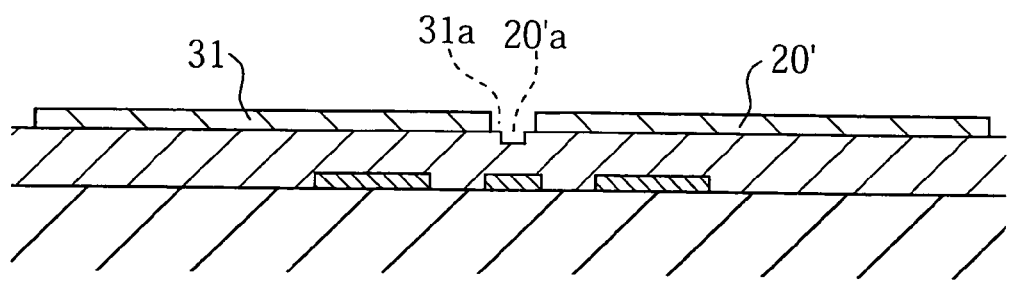
FIGS. 7A-7C show some more steps of the method subsequent to the procedure of FIG. 6.

Then, as shown in FIG. 7A, a recess 20'*a* is formed in the sacrifice layer 20' at a position that allows the recess to be exposed through the opening 31*a* of the membrane 31. Specifically, a resist pattern is formed on the membrane 31 and the sacrifice layer 20' by photolithography. With the resist pattern used as a mask, the sacrifice layer 20' is subjected to etching (reactive ion etching or RIE, for example). The depth of the recess 20'*a* may be in a range of 0.5-2.5 μm.

Figure 7B:
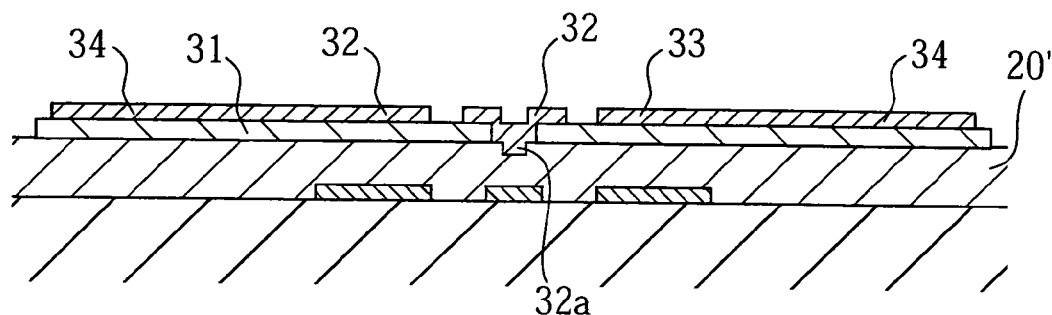

Then, as shown in FIG. 7B, a movable contact electrode 32, movable driving electrodes 33 and wiring portions 34 are formed on the membrane 31. Specifically, a Cr-layer and an Au-layer on the Cr-layer are formed on the membrane 31 and the sacrifice layer 20' by e.g. sputtering. The thickness of the Cr-layer may be 50 nm, and the thickness of the Au-layer may be 300 nm. Then, a resist pattern is formed on the Au-layer by photolithography. With the resist pattern used as a mask, the Cr— and Au-layers are subjected to etching. Thus, the movable contact electrode 32, the movable driving electrodes 33 and the wiring portions 34 as shown in FIG. 5 are obtained. In this step, the resultant movable contact electrode 32 is provided with downward projections 32*a* to ensure that the movable contact electrode 32 comes into contact with the stationary contact electrodes 11 with an appropriate contact pressure.

Figure 7C:
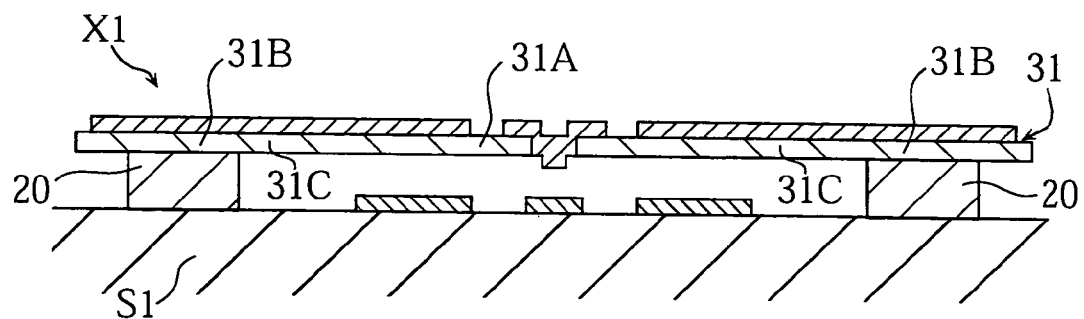

Then, as shown in FIG. 7C, supporting members 20 are formed by removing part of the sacrifice layer 20'. Specifically, the sacrifice layer 20' is subjected to dry etching (RIE). The etching gas to be used is $SF_6$ gas, for example. The etching process continues to be performed until the main portion 31A and connecting portions 31C of the membrane 31 are properly released from the substrate S1. It should be noted that in the etching, the end portions 31B of the membrane 31 serve as an etching mask for forming the supporting members 20. In this connection, as described above, the width W2 of the end portion 31B is greater than any one of the three dimensions: (1) the distance between an edge of the main portion 31A and an opening (formed in the main portion 31A) closest to the edge, (2) the formation pitch for the openings in the membrane 31, and (3) the width W3 of the connecting portion 31C. With this arrangement, part of the sacrifice layer remains between the end portion 31B and the substrate S1, while the sacrifice layer portions under the main portion 31A and the connecting portions 31C are etched away. The remaining part will serve as the supporting member 20. As seen from FIG. 7C, the width of the supporting member 20 is smaller than the width W2 of the end portion 31B since undercuts are formed due to the etching under the end portion 31B.

In the above-described etching process, the etching gas can act on the sacrifice layer under the main portion 31A more than under the end portions 31B because of the presence of the openings 31b of the membrane 31 and the openings 32b, 33a of the movable contact electrode 32 or the movable driving electrodes 33. When dry etching is employed, the sacrifice layer 20' may preferably be made of silicon, while the membrane 31 may preferably be made of silicon dioxide or silicon nitride.

To make the supporting members 20, an wet etching technique may be employed in place of the dry etching. In this case, the etchant to be used may be buffered fluoric acid (BHF), which contains fluoric acid and ammonium fluoride. The wet etching is performed in a manner such that the main portion 31A and connecting portions 31C of the membrane 31 are properly released from the substrate S1. For performing wet etching, the sacrifice layer 20' may preferably be made of silicon dioxide, while the membrane 31 may preferably be made of silicon. After the wet etching is performed, the etched object need be dried. To prevent the dried element from suffering the sticking, supercritical drying may preferably be employed.

Figure 8:
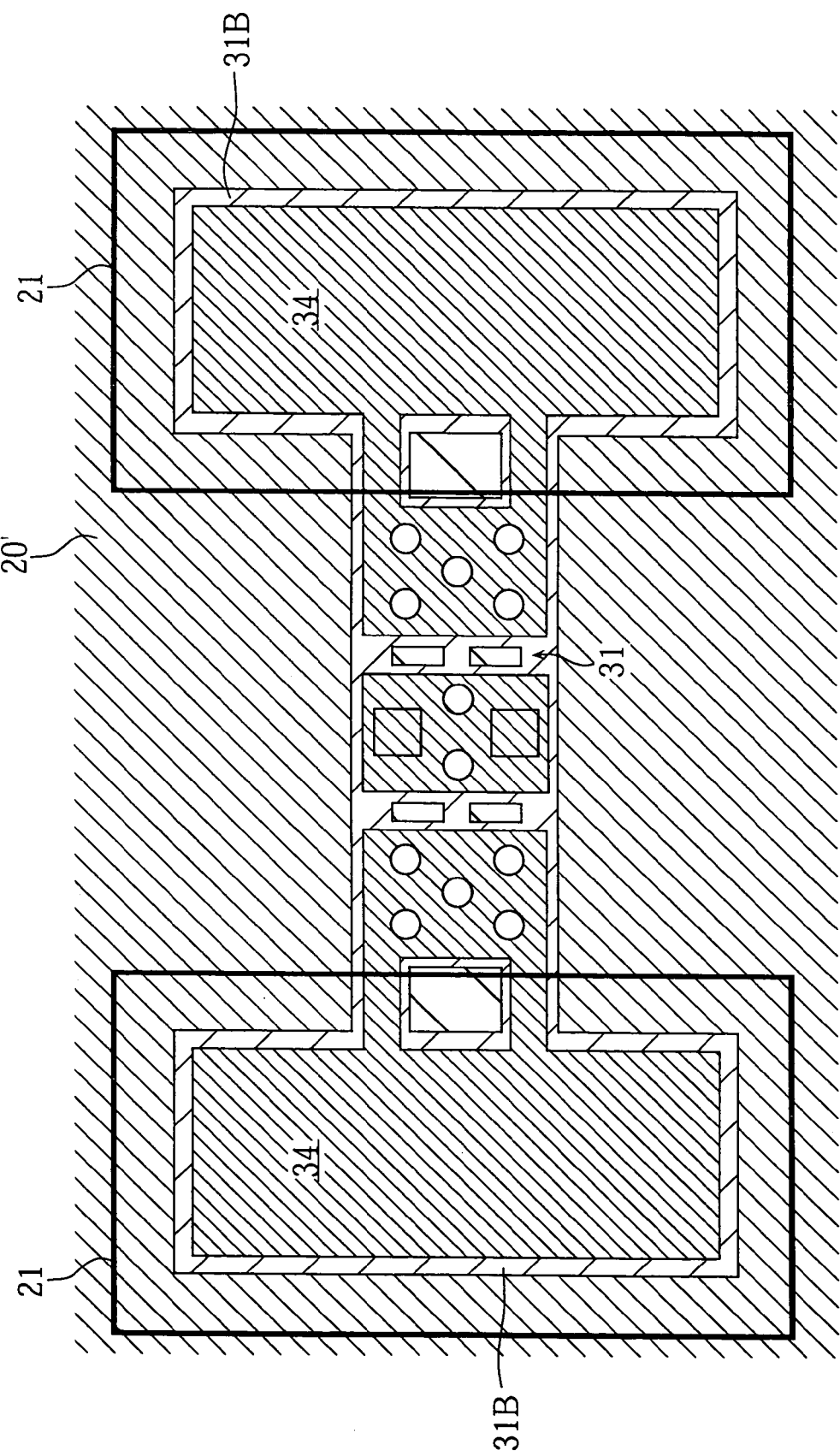
FIG. 8 is an alternative step for the method.
Figure 9:
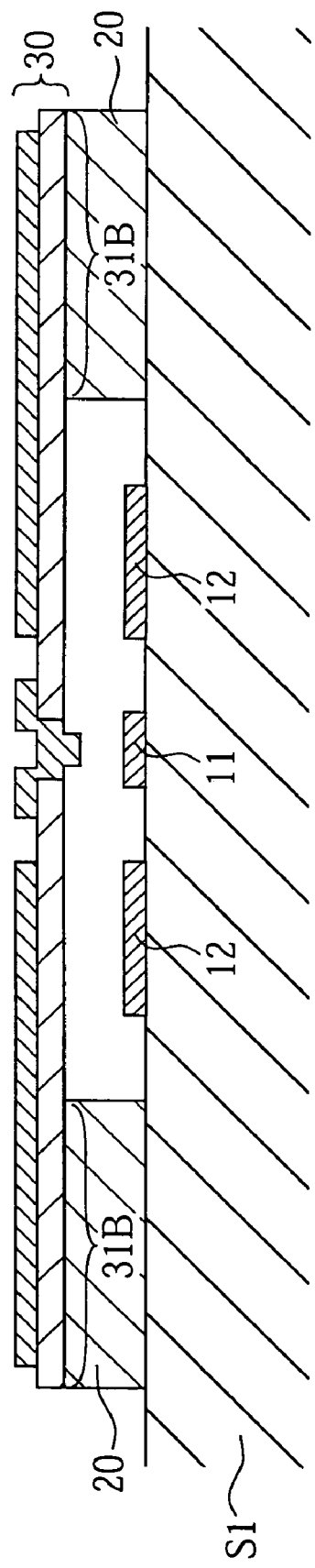
FIG. 9 is a sectional view taken along lines II-II in FIG. 1, illustrating the case where the alternative step is adopted.

As noted above, in performing the etching to the sacrifice layer 20', the end portion 31B is used as the mask for forming the supporting member 20. According to the present invention, resist patterns 21 shown in FIG. 8 may be used as the mask (the contour of the resist patterns are depicted in thick lines) in place of the end portion 31B. Each resist pattern 21 has a larger surface area than the end portion 31B of the membrane 31, with its peripheral region projecting by a predetermined distance beyond the edge of the end portion 31B. The adjustment of this distance enables the control of the formation of an undercut to be made under the resist pattern 21 when the sacrifice layer 20' is subjected to the etching. Specifically, when the projection distance is small enough, a relatively large undercut will be made. When the projection distance is large enough, on the other hand, a relatively small undercut or no undercut will be made. When no undercut is made, referring to FIG. 9, the resultant supporting member 20 has the same width as the end portion 31B. In other words, the supporting member 20 can be made thicker than when no resist pattern 21 is used (see FIG. 7C). This is advantageous for the supporting member 20 to be able to support a load more stably. When the resist pattern 21 is used, the end portion 31B of the membrane 31 does not need to serve as an etching mask for making the support member 20. Thus, it is possible to reduce the size of the end portion 31B, which contributes to the downsizing of the switching element X1.

After the etching is completed, the resist patterns 21 are removed by the action of oxygen plasma, for example.

The micro-switching element X1 of the present invention is produced in the manner described above. According to the method, there is no need to form the paired supporting members 20 before the sacrifice layer 20' is formed. In addition, there is no need to perform the patterning of the sacrifice layer 20' before the membrane 31 of the movable beam is formed on the sacrifice layer 20'. The paired supporting members 20 are formed as the remaining portions of the sacrifice layer 20' between the substrate S1 and the membrane 31 as the other portions of the sacrifice layer 20' (the portions providing the surface upon which the membrane 31 is formed) are removed. In this manner, the paired supporting members 20 can be made efficiently. Further, in accordance with the method of the present invention, there is no need to form members to reinforce the ends of the movable beam 30, and no step of grinding the sacrifice layer 20' is needed. Accordingly, the micro-switching element X1 of the present invention is produced with high efficiency and high yield.

Figure 10:
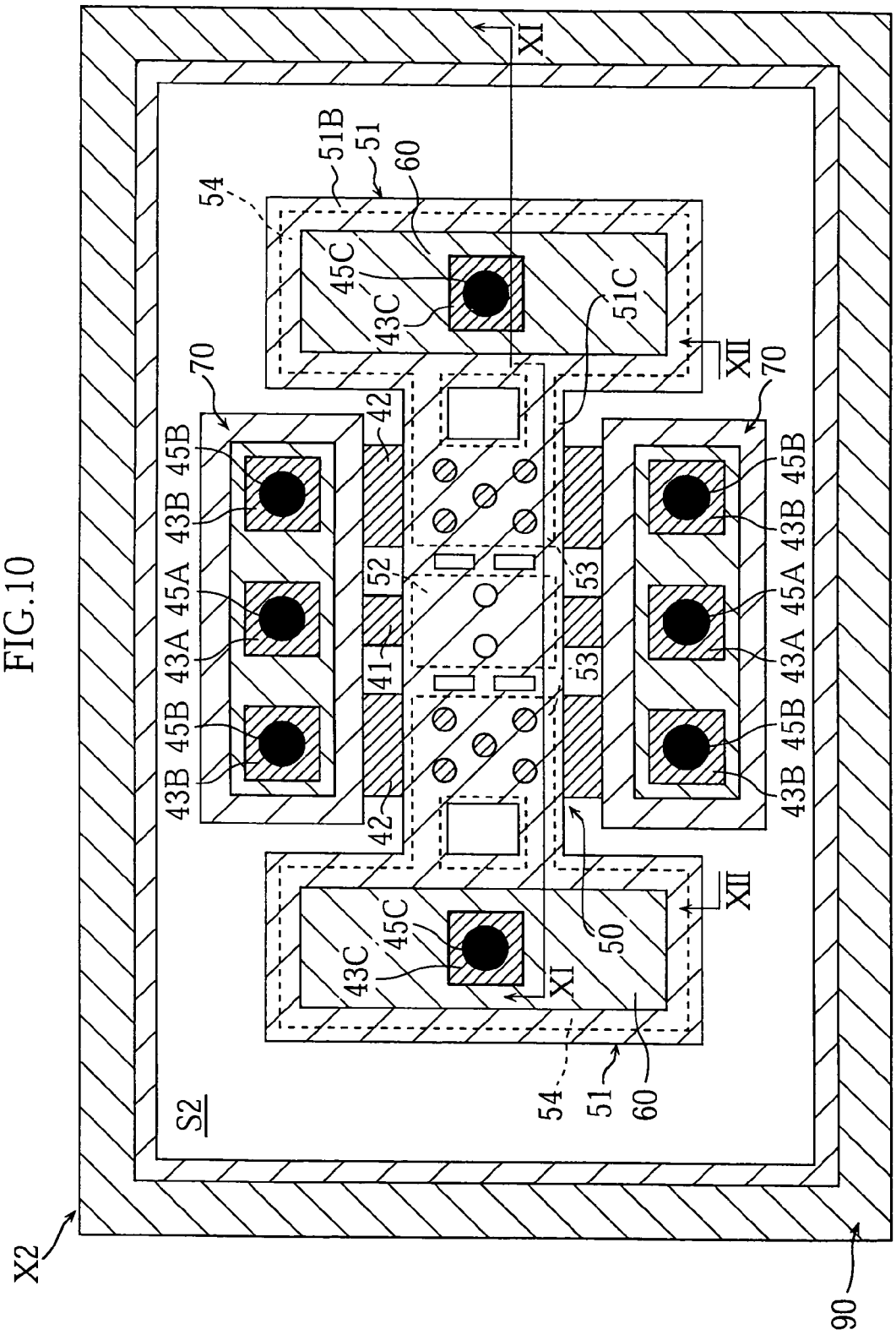
FIG. 10 is a plan view showing a micro-switching element according to a second embodiment of the present invention.
Figure 11:
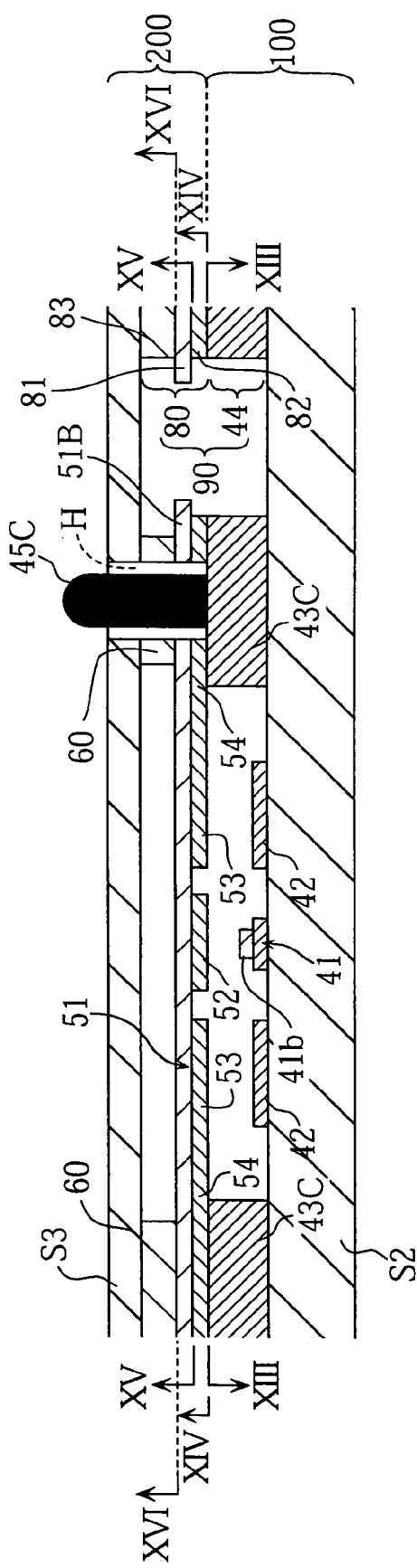
FIG. 11 is a sectional view taken along lines XI-XI in FIG. 10.
Figure 12:
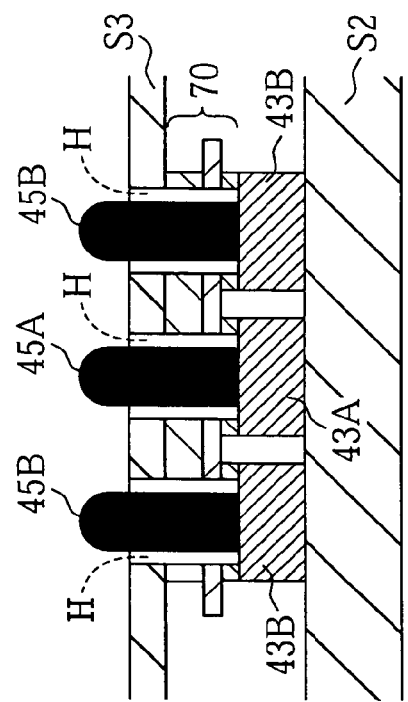
FIG. 12 is a sectional view taken along lines XII-XII in FIG. 10.

FIGS. 10-16 show a micro-switching element X2 according to a second embodiment of the present invention. Specifically, FIG. 10 is a plan view showing the switching element X2. FIGS. 11 and 12 are partial sectional views taken along lines XI-XI and XII-XII in FIG. 10, respectively. FIGS. 13-16 are sectional views or partial sectional views taken along lines XIII-XIII, XIV-XIV, XV-XV and XVI-XVI in FIG. 11, respectively. As shown in FIG. 11, the switching element X2 includes a base assembly (lower assembly) 100 and a cap assembly (upper assembly) 200 bonded to the base assembly 100.

Figure 13:
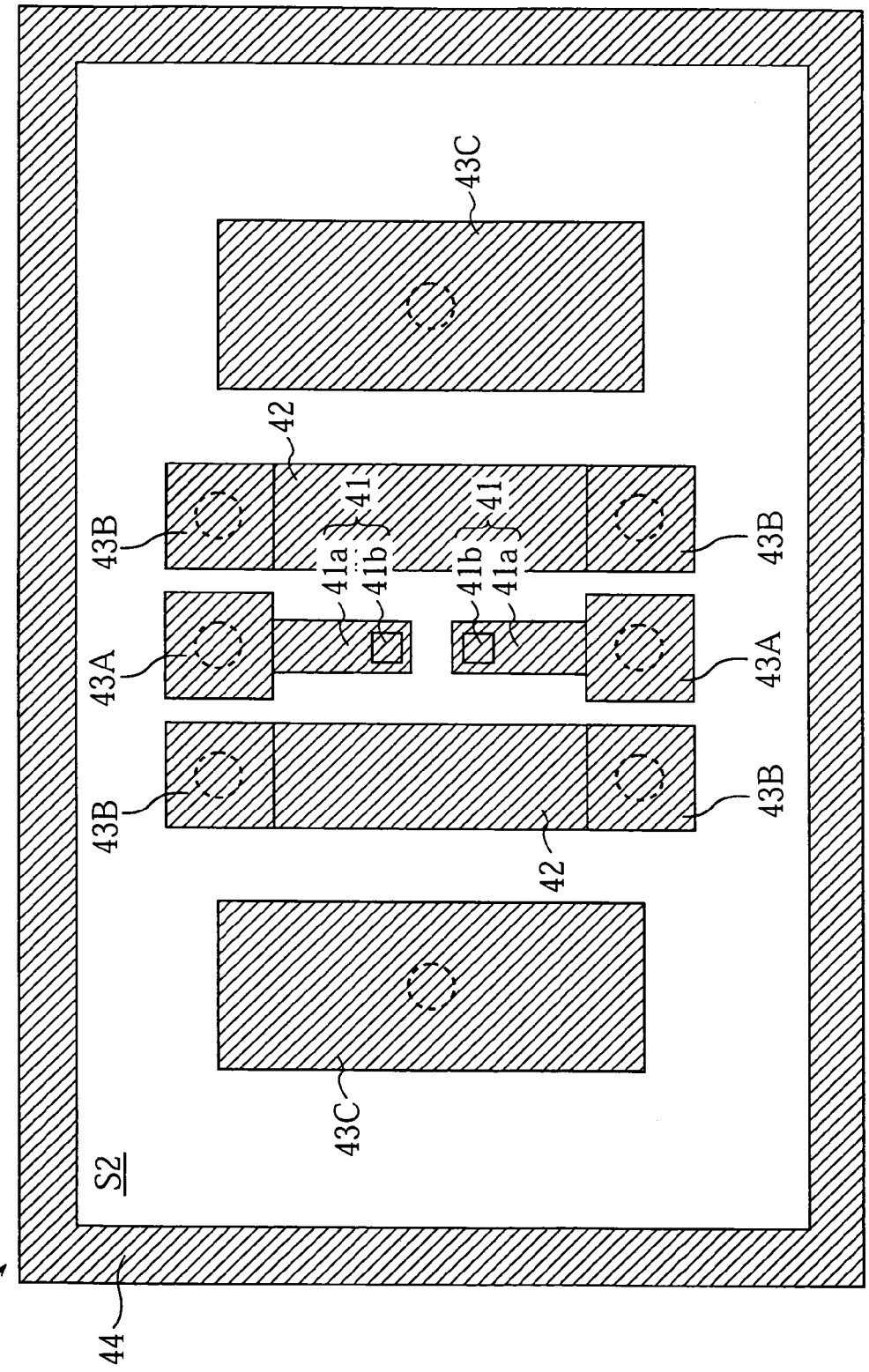
FIG. 13 is a sectional view taken along lines XIII-XIII in FIG. 10.

As shown in FIG. 13, the base assembly 100 includes a substrate S2, a pair of stationary contact electrodes 41, two stationary driving electrodes 42, three pairs of electrode pads 43A, 43B, 43C and a circumferential wall 44.

The stationary contact electrodes 41 are spaced from each other on the substrate S2. Each contact electrode 41 includes a rectangular strip (main part) 41a and a projection 41b disposed at one end of the strip 41a. At the other end, the strip 41a is connected to one of the electrode pads 43A. The projection 41b ensures a sufficient contact pressure when the movable contact electrode 52 comes into contact with the stationary contact electrode 41. Each electrode pad 43A is provided with a bump 45A, as shown in FIG. 12. In FIG. 13, the bump-providing area for each electrode pad is indicated by a circle of broken lines. The stationary contact electrodes 41 are connected in series to a circuit that requires switching operation via the electrode pads 43A, the bumps 45A and non-illustrated wiring. The two stationary driving electrodes 42, flanking the stationary contact electrodes 41, are arranged on the substrate S2 in a symmetrical manner with respect to the contact electrodes 41. Each of the stationary driving electrodes 42 is connected at its both ends to the appropriate electrode pads 43B each of which is provided with a bump 45B (see FIG. 12). The stationary driving electrodes 42 are grounded via the electrode pads 43B, the bumps 45B and non-illustrated wiring. As shown in FIG. 11, each of the electrode pads 43C is provided with a bump 45C. In the illustrated base assembly 100, the electrode pads 43A-43C and the circumferential wall 44 have the same height above the upper surface of the substrate S2.

As shown in FIGS. 10 and 14-16, the cap assembly 200 includes a substrate S3 (omitted in FIG. 10), a movable beam 50, a pair of supporting members or spacers 60, two inner sealing walls 70 and a circumferential wall 80.

Figure 14:
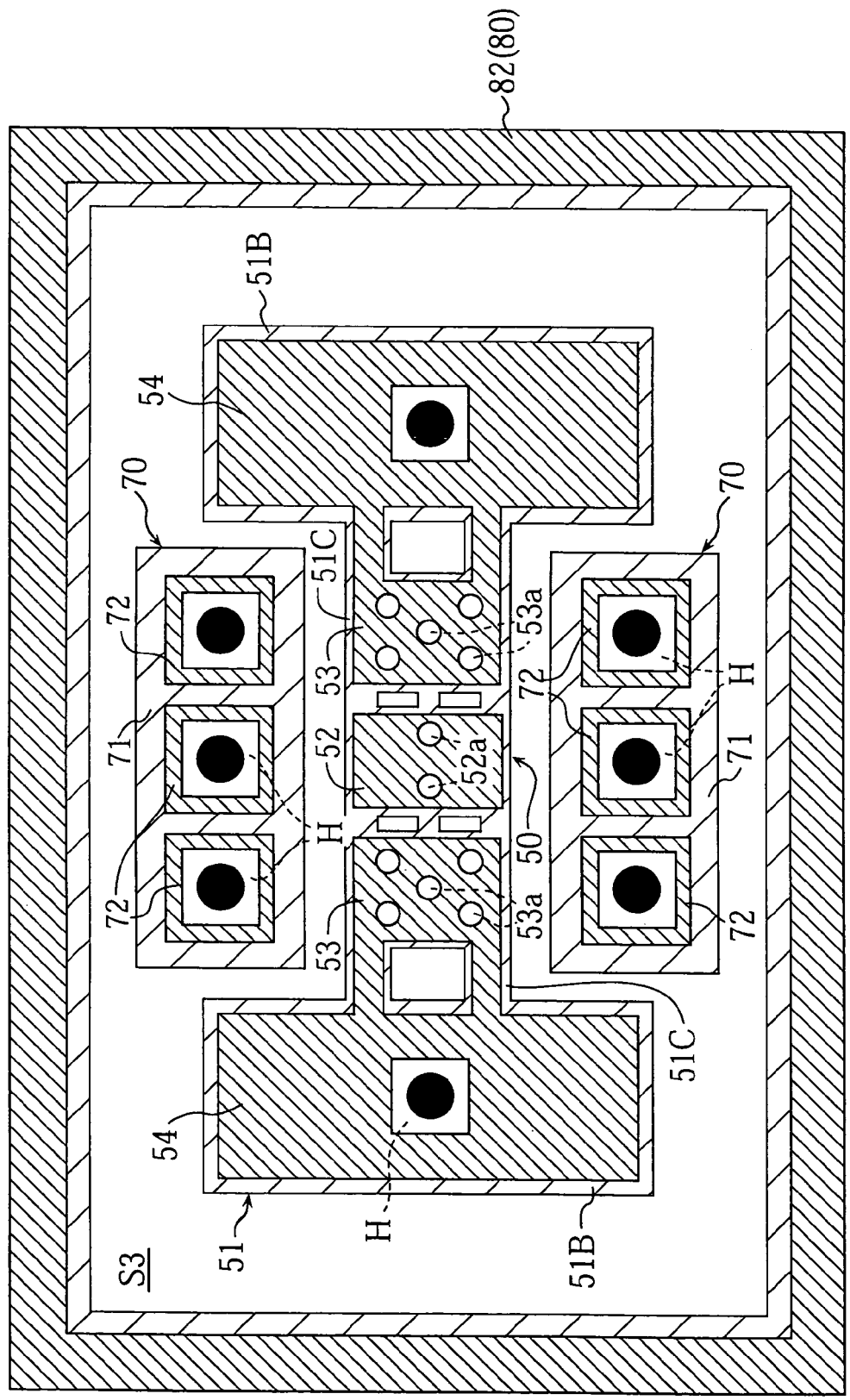
FIG. 14 is a sectional view taken along lines XIV-XIV in FIG. 10.

The movable beam 50 includes a membrane 51, a movable contact electrode 52, two movable driving electrodes 53, and two wiring portions 54. FIG. 14 shows the arrangement of the contact electrode 52, the driving electrodes 53 and the wiring portions 54. FIG. 15 shows the configuration of the membrane 51. As shown in FIG. 11, the movable beam 50 is connected to the substrate S3 via the spacers 60. The beam 50 bridges between the two spacers 60, while also bridging between the two electrode pads 43C of the base assembly 100. FIG. 16 shows the arrangement of the spacers 60.

As shown in FIG. 15, the membrane 51 of the movable beam 50 includes a main portion 51A, a pair of end portions 51B and four connecting portions 51C that connect the main portion 51A to the respective end portions 51B. The main portion 51A is formed with a plurality of openings 51a. These openings may be in the form of a circle having a diameter of 5 µm, for example. The length L1' of the main portion 51A may be in a range of 150-300 µm, while the width W1' may be in a range of 100-250 μm. Preferably, the thickness of the membrane 51 may be no smaller than 1.5 μm and the quotient W1'/L1' may be no smaller than 0.4 for preventing the membrane 51 (hence the beam 50) from deforming improperly. Each end portion 51B comes into direct contact with one of the spacers 60 and has a width W2' of 100-200 μm, for example. Each connecting portion 51C has a width W3' of 5-30 μm. As in the first embodiment described above, the width W2' of the end portion 51B is greater than any one of the three dimensions as follows: (1) the distance between an edge of the main portion 51A and an opening 51a closest to the edge (the distance may be in a range of 10-30 μm, for example), (2) the formation pitch for the openings 51a (the pitch may be in a range of 10-30 μm, for example), and (3) the width W3'.

The movable contact electrode 52, formed on the membrane 51, corresponds in position to the inner ends of the respective stationary contact electrodes 41, as seen from FIGS. 13 and 14. The movable contact electrode 52 is formed with openings 52a arranged to communicate with the appropriate ones of the openings 51a of the membrane 51, as seen from FIGS. 14 and 15.

Each of the movable driving electrodes 53, formed on the membrane 51, corresponds in position to one of the stationary driving electrodes 42, as seen from FIGS. 13 and 14. Each movable driving electrode 53 is formed with openings 53a arranged to communicate with the appropriate ones of the openings 51a of the membrane 51, as seen from FIGS. 14 and 15.

Each of the wiring portions 54 is formed on the appropriate end portion 51B and connecting portions 51C of the membrane 51, to be connected to the adjacent movable driving electrode 53. Each wiring portion 54 is also connected to one of the electrode pads 43C by direct contact therewith (see FIG. 11). The two wiring portions 54 are connected to each other via the electrode pads 43C, the bumps 45C and non-illustrated wiring. Accordingly, the two movable driving electrodes 53 (formed integral with the wiring portions 54) are also connected to each other.

As shown in FIG. 12, the inner sealing wall 70 has a multi-layer structure. The wall 70 extends between the substrate S3 and the electrode pads 43A, 43B to define part of each hole H of the cap assembly 200 into which the bump 45A, 45 B is inserted. The holes H of the cap assembly 200 correspond in position to the electrode pads 43C and extend through the substrate S3, the spacer 60, the end portion 51B and the wiring portion 54. The bumps 45A-45C each project from the corresponding one of the holes H. As shown in FIG. 11, the circumferential wall 80 of the cap assembly 200 and the circumferential wall 44 of the base assembly 100 are combined to provide a circumferential sealing wall 90. The substrates S2-S3, the circumferential sealing wall 90, the inner sealing wall 70, and the portions defining part of the hole H for receiving the bump 45C (i.e., the spacer 60, the end portion 51B of the membrane 51, the wiring portion 54, and the electrode pad 43C) electrically separate the inside of the switching element from the outside. Specifically, the movable contact electrode 52, the paired stationary contact electrodes 41, the two movable driving electrodes 53 and the two stationary driving electrodes 42 are sealed into the inside of the switching element.

In the micro-switching element X2 with the above arrangements, electrostatic attraction is generated between the movable driving electrodes 53 and the relevant stationary driving electrodes 42 when an appropriate potential is applied to the movable driving electrodes 53 via the bump 45C and the wiring portion 54. As a result, the movable beam 50 is resiliently deformed downward until the micro-switching element X2 is closed, i.e., the movable driving electrode 52 comes into contact with the projections 41b of the respective stationary contact electrodes 41. In the closed state, the two stationary contact electrodes 41 are electrically bridged by the movable contact electrode 52, so that current can flow through the electrodes 41.

When the potential application to the movable driving electrodes 53 is stopped, the electrostatic attraction between the driving electrodes 53 and the driving electrodes 42 disappears, allowing the movable beam 50 to return to the natural position. As a result, the movable contact electrode 52 is separated from the projections 41b of the stationary contact electrodes 41. This brings the micro-switching element X2 into the open state shown in FIG. 11. In the open state, the stationary contact electrodes 41 are electrically separated from each other, whereby no current passes through the contact electrodes 41.

Figure 17A:
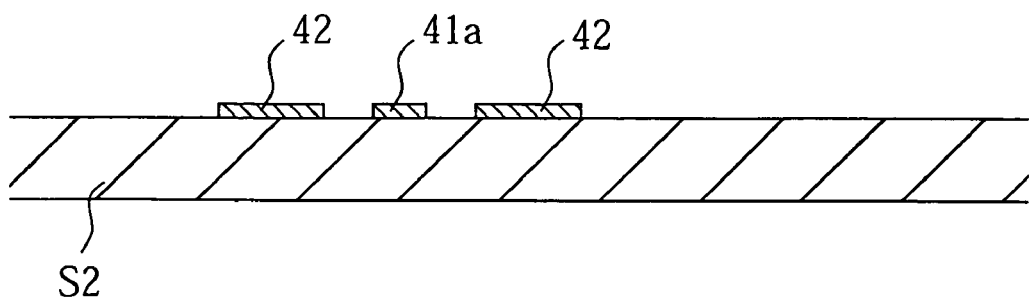
FIGS. 17A-17C show procedure for making a base assembly of the switching element of the second embodiment.
Figure 17B:
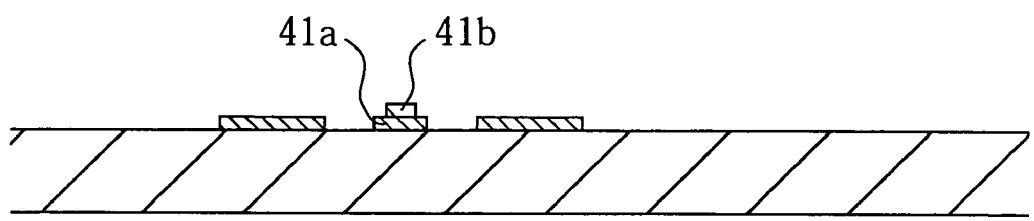
Figure 17C:
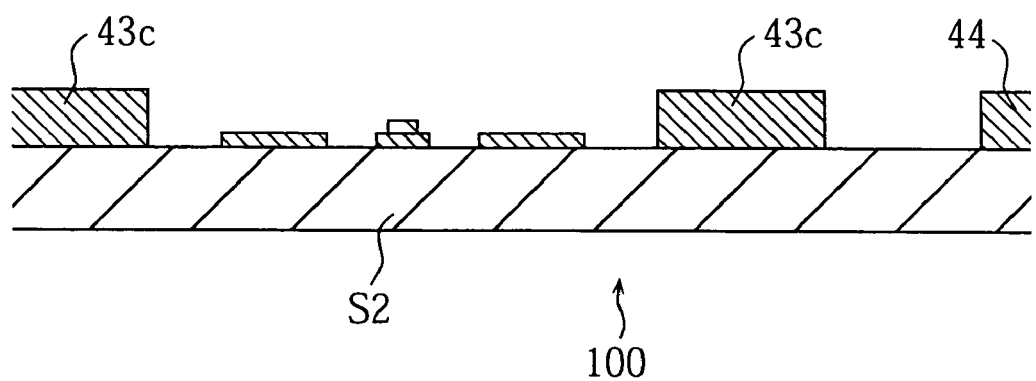

FIGS. 17A-17C, 18A-18E and 19A-19D illustrate a method of making the micro-switching element X2 described above. Each sectional view corresponds in position to the sectional view of FIG. 11. FIGS. 17A-17C show the process of making the base assembly 100. FIGS. 18A-18E show the process of making the cap assembly 200. FIGS. 19A-19D show the process of combining the base and the cap assemblies and some subsequent process.

The base assembly 100 of the micro-switching element X2 may be made in the following manner. First, as shown in FIG. 17A, the main part 41a of a stationary contact electrode 41 and stationary driving electrodes 42 are formed on an insulating substrate S2. Specifically, a Cr layer is formed on the substrate and then an Au layer is formed on the Cr layer (both layers can be formed by sputtering, for example). The thickness of the Cr layer may be 50 nm, while the thickness of the Au layer may be 1 μm. The substrate S2 may be made of a high-resistivity silicon material. For producing the main parts 41a and the stationary driving electrodes 42, an appropriate resist pattern is formed on the two-layer conductor (Cr layer and Au layer) by photolithography, for example. With the resist pattern used as a mask, the two-layer conductor is subjected to etching, to provide the main parts 41a and the stationary driving electrodes 42 as shown in FIG. 13.

Then, as shown in FIG. 17B, a projection 41b is formed on each of the main parts 41a. Specifically, a Cr layer and an Au layer are successively formed on the main part 41a by sputtering, for example. The thickness of the Cr layer may be 50 nm, while the thickness of the Au layer may be 500 nm. Then, a resist pattern is formed on the Au layer by photolithography. Finally, with the resist pattern used as a mask, the Au layer is subjected to etching, so that the desired projection 41b is provided on the main part 41a.

Then, referring to FIG. 17C, electrode pads 43A-43C as shown in FIG. 13 and a circumferential wall 44 are formed on the substrate S2. Specifically, a Cr layer and an Au layer are successively formed on the substrate S2 by sputtering, for example. The thickness of the Cr layer may be 50 nm, while the thickness of the Au layer may be 2.6 μm. Then, a resist pattern is formed on the Au layer by photolithography. Finally, with the resist pattern used as a mask, the Au layer is subjected to etching, so that the desired electrode pads 43A-43C and circumferential wall 44 are provided on the substrate S2. Thereafter, the stationary driving electrodes 42 are coated with insulating film (not shown) for preventing the stationary driving electrodes 42 from coming into electrical contact with the movable driving electrodes 53 during the operation of the micro-switching element X2. Thus, the base assembly 100 is obtained.

Figure 18A:
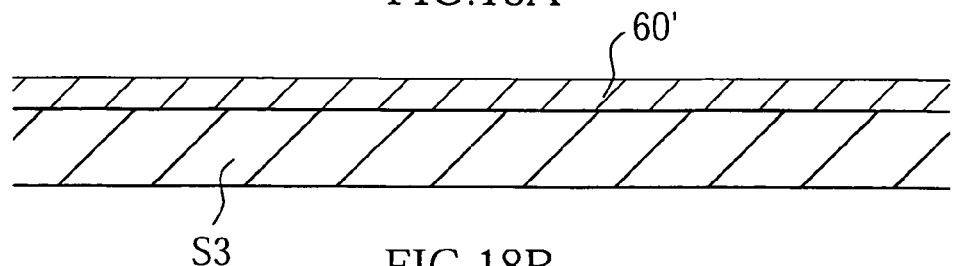
FIGS. 18A-18E show procedure for making a cap assembly of the switching element of the second embodiment.

The cap assembly 200 of the micro-switching element X2 may be made in the following manner. First, as shown in FIG. 18A, a sacrifice layer 60' is formed on a substrate S3 by sputtering, for example. The sacrifice layer 60' may be made of silicon or silicon dioxide and have a thickness of 1-3 μm. Preferably, the material for making the sacrifice layer 60' is undoped.

Figure 18B:
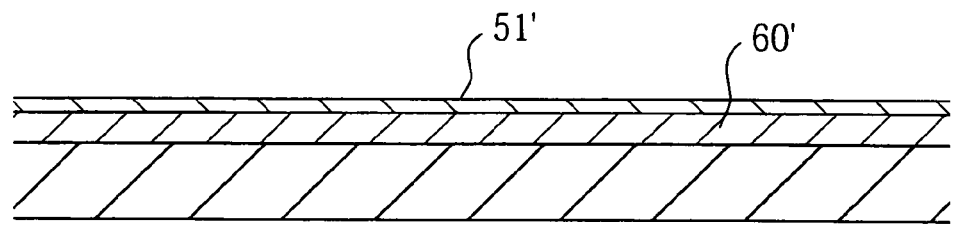

Then, as shown in FIG. 18B, a material layer 51' is formed on the sacrifice layer 60' by plasma CVD, for example. The thickness of the material layer 51' is 2 μm, for example. The material layer 51' and the sacrifice layer 60' should exhibit different etching rates when the sacrifice layer 60' is subjected to etching to be described later. To this end, the material layer 51' may be made of silicon dioxide or silicon nitride when the sacrifice layer 60' is made of silicon. When the sacrifice layer 60' is made of silicon dioxide, the material layer 51' may be made of silicon.

Figure 18C:
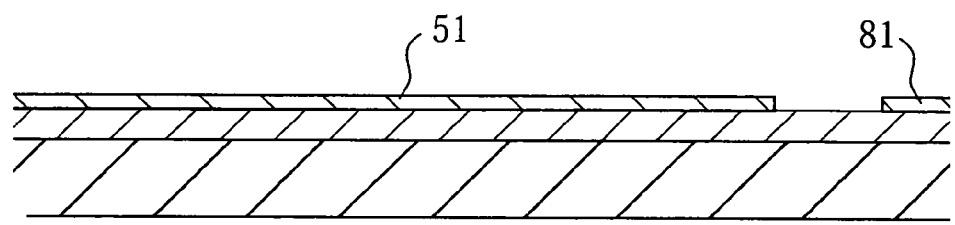

Then, as shown in FIG. 18C, the material layer 51' is processed into a membrane 51 and a layer pattern 81. At this stage, a wall pattern 71 (as the one shown in FIG. 15 but not provided with openings yet) is also formed. Specific steps of the processing may be similar to those described above regarding the formation of the membrane 31 of the micro-switching element X1. The resultant membrane 51 is formed with a plurality of openings 51a. The wall pattern 71 constitutes part of the inner sealing wall 70, while the wall pattern 80 constitutes part of the circumferential wall 80.

Figure 18D:
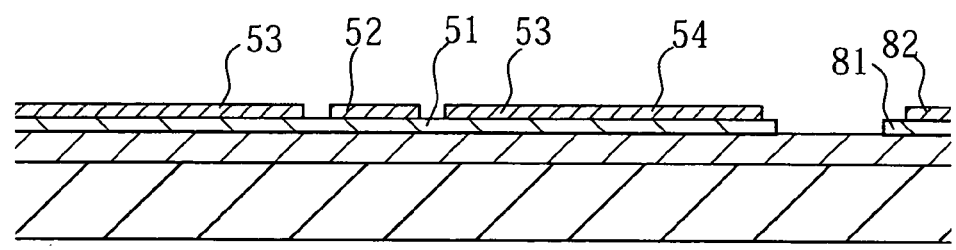

Then, as shown in FIG. 18D, a movable contact electrode 52, movable driving electrodes 53 and a wiring portion 54 are formed on the membrane 51, while a wall pattern 82 is formed on the wall pattern 81. At this stage, a wall pattern 72 (as the one shown in FIG. 14 but not provided with openings yet) is also formed. Specific steps of the processing may be similar to those described above regarding the formation of the movable contact electrode 32, the movable driving electrodes 33 and the wiring portion 34 on the membrane 31 of the micro-switching element X1. The wall pattern 72 constitutes part of the inner sealing wall 70, while the wall pattern 82 constitutes part of the circumferential wall 80.

Figure 18E:
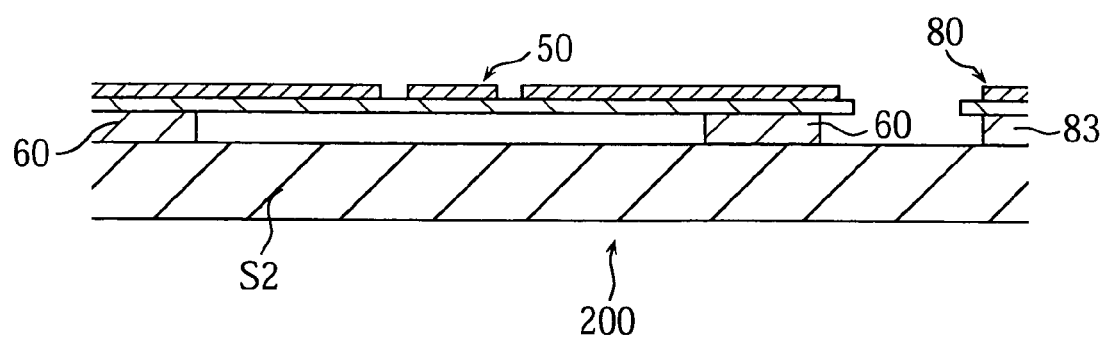

Then, as shown in FIG. 18E, the sacrifice layer 60' is subjected to dry etching or wet etching to remove part of the layer 60' so that the remaining portions constitute spacers 60 and wall pattern 83. At this stage, the wall pattern 73 (as the one shown in FIG. 16 but not provided with openings yet) is also formed as a remaining part. Specific steps of the processing may be similar to those described above regarding the supporting members 20 of the micro-switching element X1. The wall pattern 73 constitutes part of the inner sealing wall 70, while the wall pattern 83 constitutes part of the circumferential wall 80. In the above described process, the cap assembly 200 is obtained, which includes the substrate S3, the movable beam 50, the spacers 60, the inner sealing wall 70 (the wall pattern 71, 72, 73), and the circumferential wall 80 (the wall pattern 81, 82, 83).

Figure 19A:
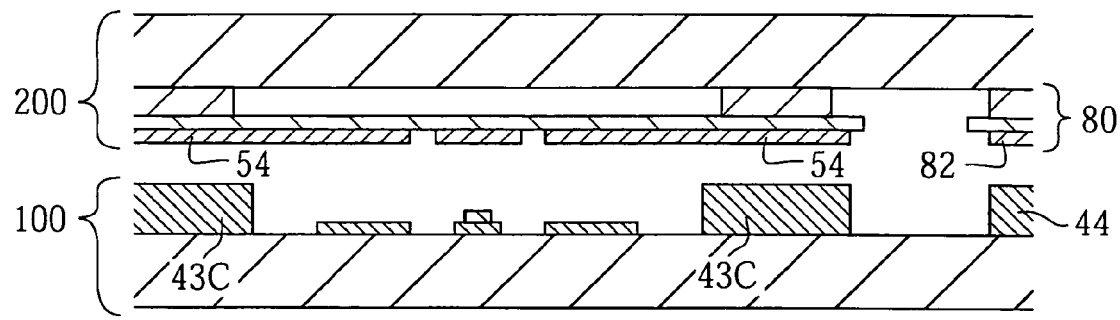
FIGS. 19A-19D show procedure subsequent to that shown in FIG. 18.
Figure 19B:
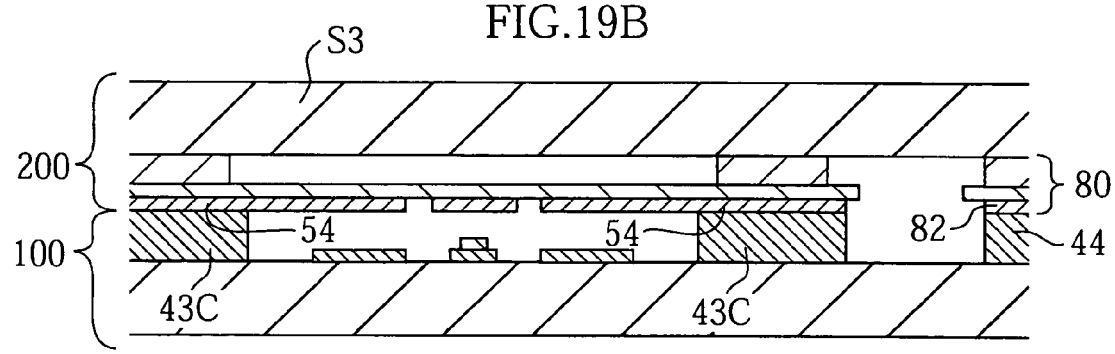

To produce the micro-switching element X2, the above-described base assembly 100 and cap assembly 200 are bonded to each other, as shown in FIGS. 19A and 19B, via at least a bonding wall. Specifically, the circumferential wall 44 (bonding wall) and the electrode pads 43A-43C of the base assembly 100 shown in FIG. 13 are connected to the wall pattern 82 of the circumferential wall 80, the wall pattern 72 of the inner sealing wall 70 and the wiring portions 54 of the cap assembly 200 shown in FIG. 14. When all the connecting areas of the two assemblies are made of Au, the base assembly 100 and the cap assembly 200 can be properly bonded to each other under a heated (300° C., for example) and pressured condition. In this manner, a gas that would degrade the contact electrodes 41, 52 is not generated from the bonding boundary. Accordingly, the Au bonding method is advantageous for ensuring a long life of the switching element.

Figure 19C:
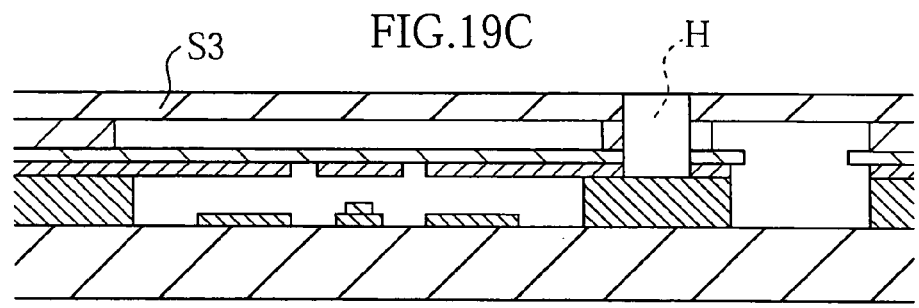
Figure 19D:
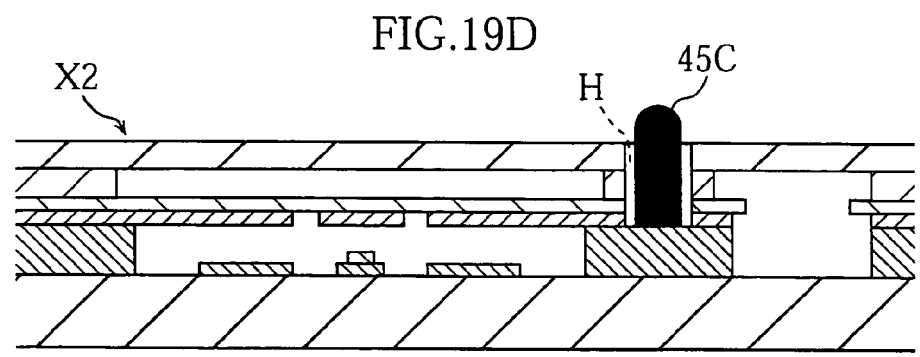
Figure 20:
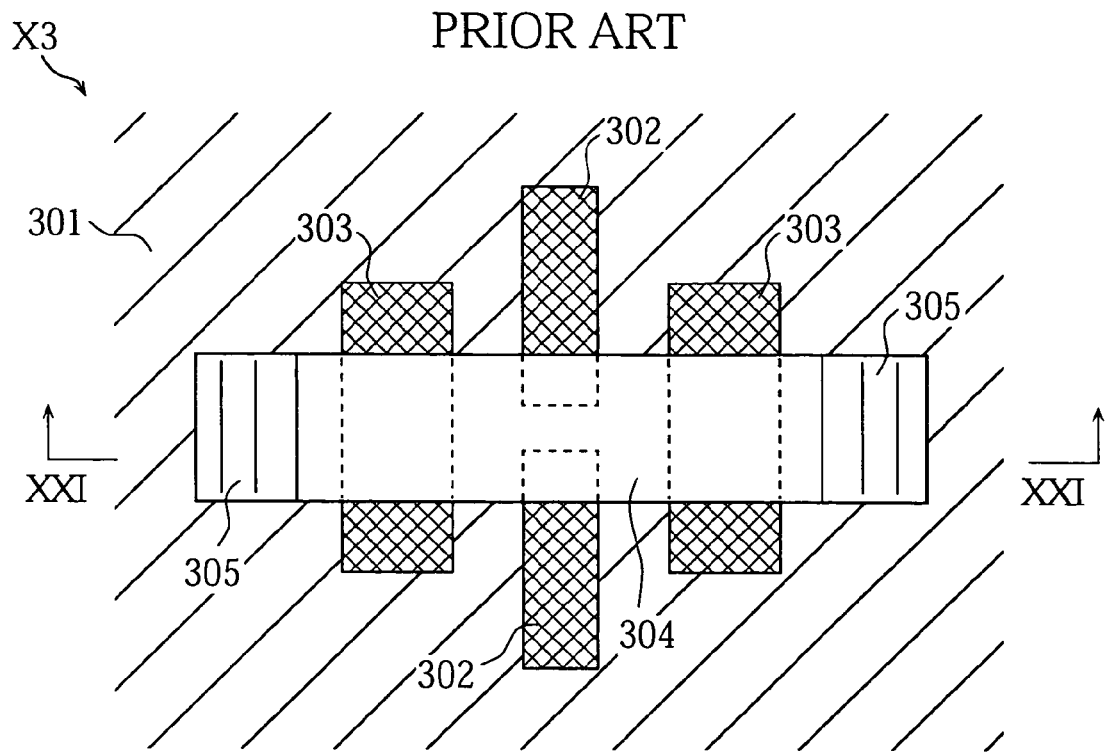
FIG. 20 is a plan view showing principal portions of a conventional micro-switching element.
Figure 21:
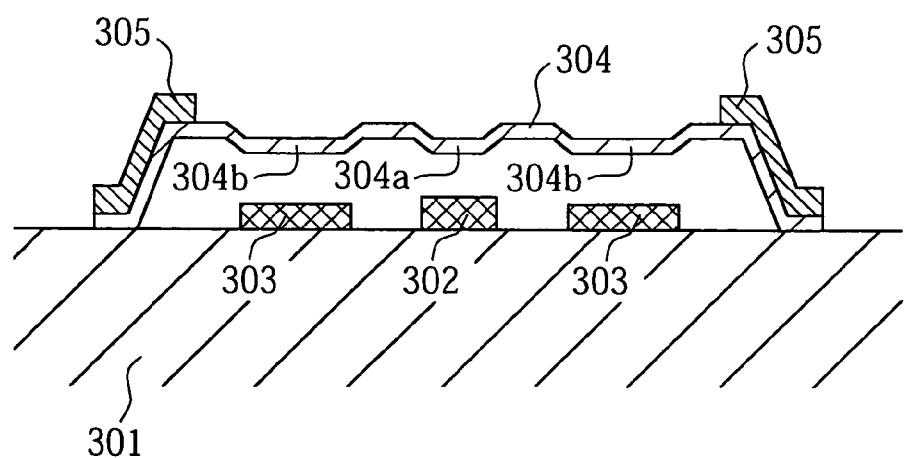
FIG. 21 is a sectional view taken along lines XXI-XXI in FIG. 20.
Figure 22A:
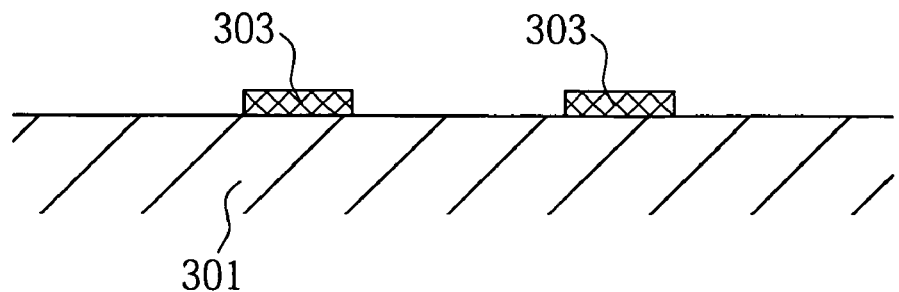
FIGS. 22A-22D show some steps of a method of making the switching element shown in FIG. 20.
Figure 22B:
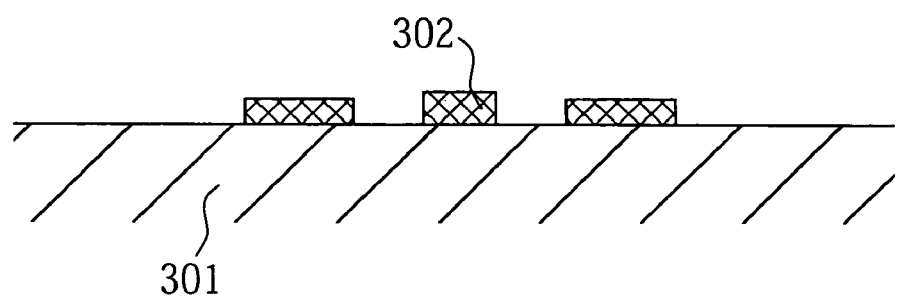
Figure 22C:
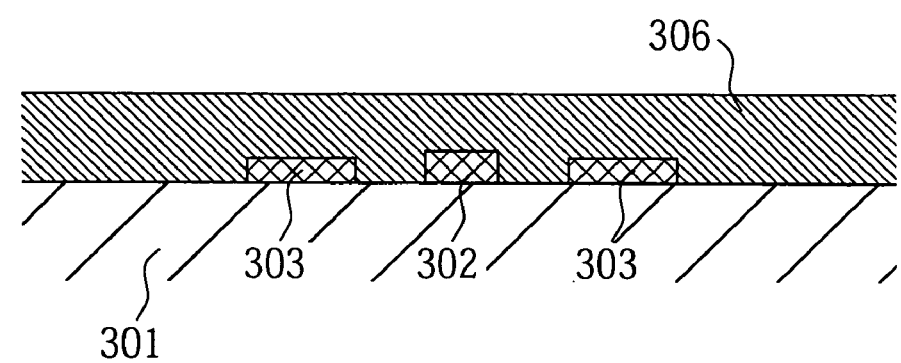
Figure 22D:
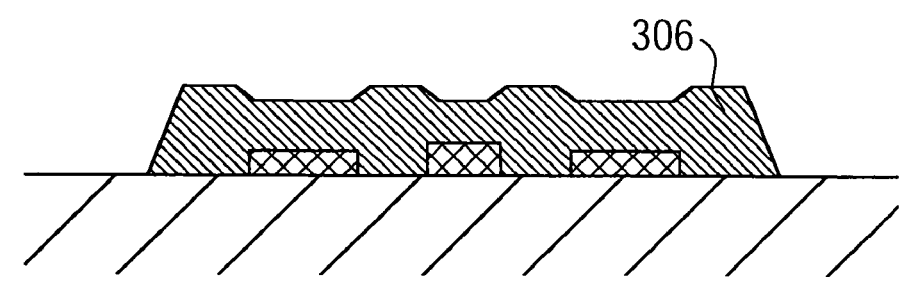
Figure 23A:
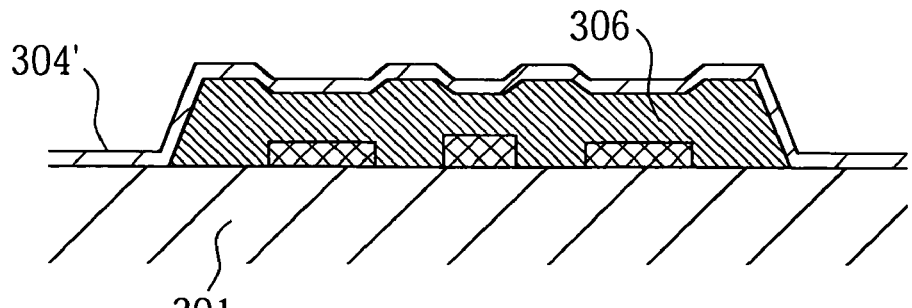
FIGS. 23A-23D show procedure subsequent to the steps shown in FIG. 22.
Figure 23B:
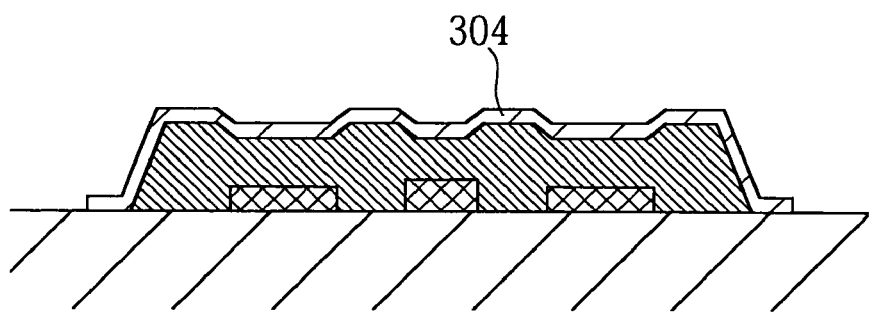
Figure 23C:
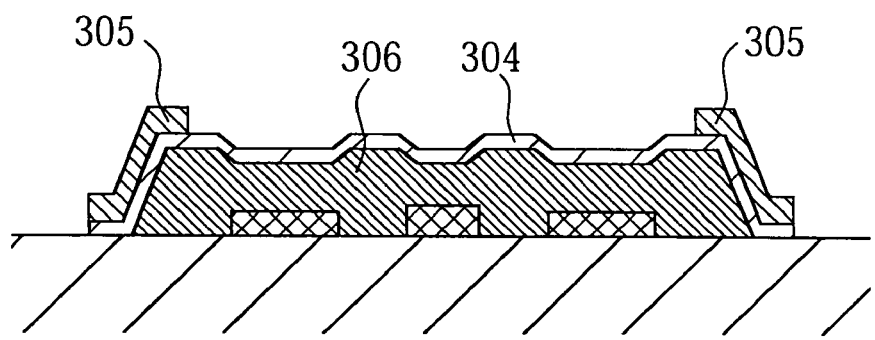
Figure 23D:
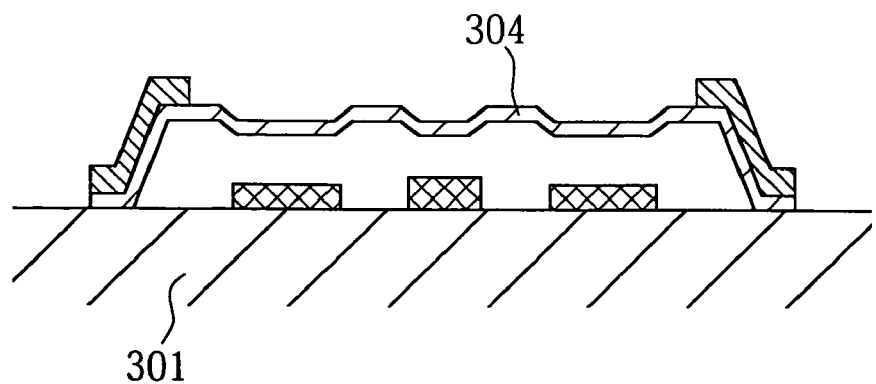
Figure 24:
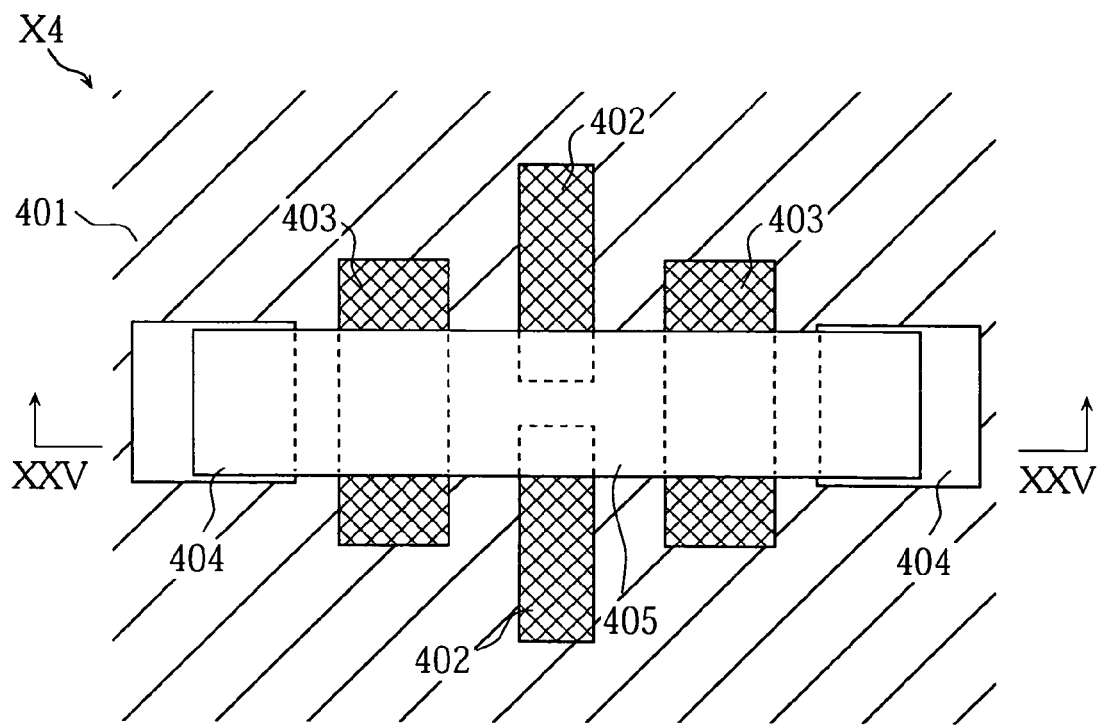
FIG. 24 is a plan view showing principal portions of another conventional micro-switching element.
Figure 25:
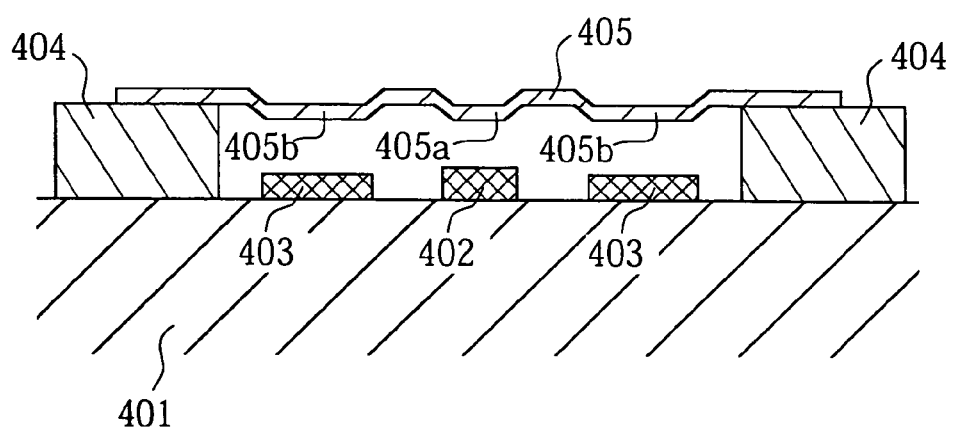
FIG. 25 is a sectional view taken along lines XXV-XXV in FIG. 24.
Figure 26A:
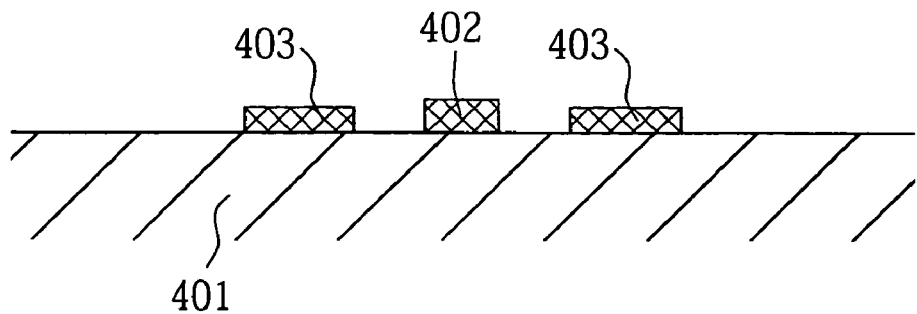
FIGS. 26A-26D show some steps of a method of making the conventional switching element shown in FIG. 24.
Figure 26B:
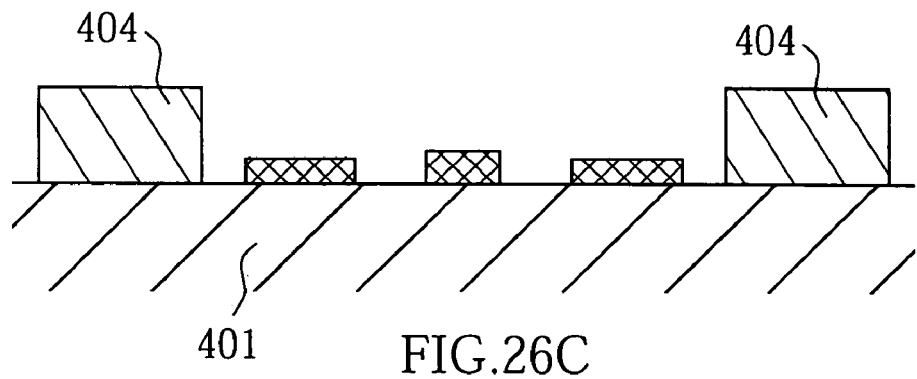
Figure 26C:
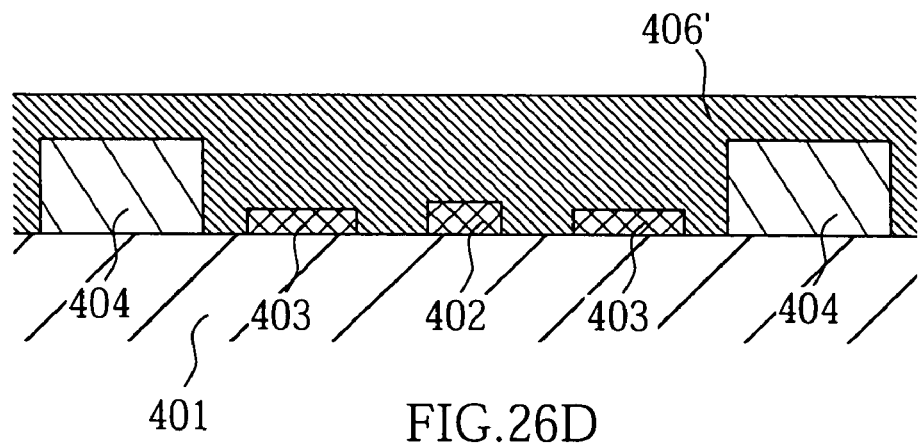
Figure 26D:
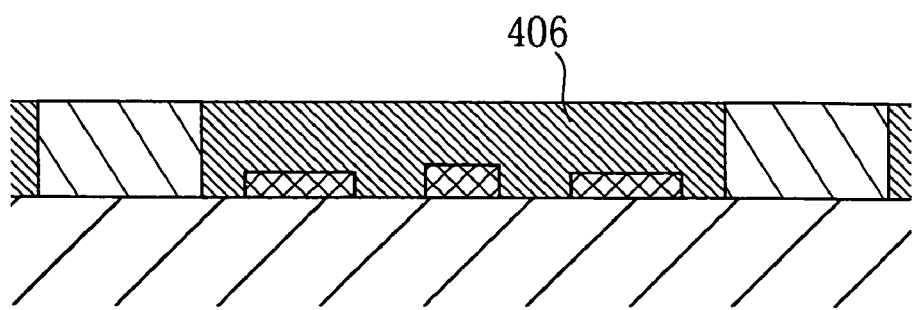
Figure 27A:
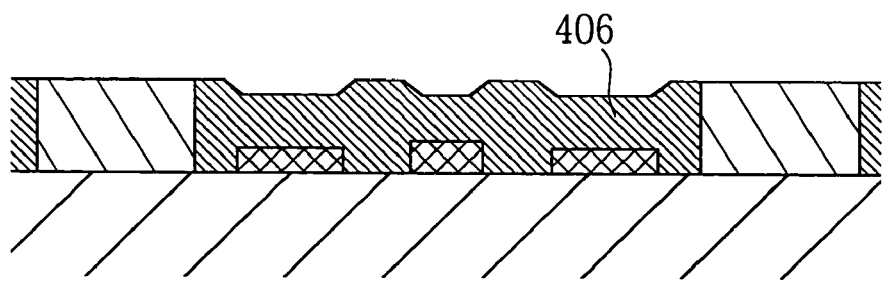
FIGS. 27A-27D show procedure subsequent to the steps shown in FIG. 26.
Figure 27B:
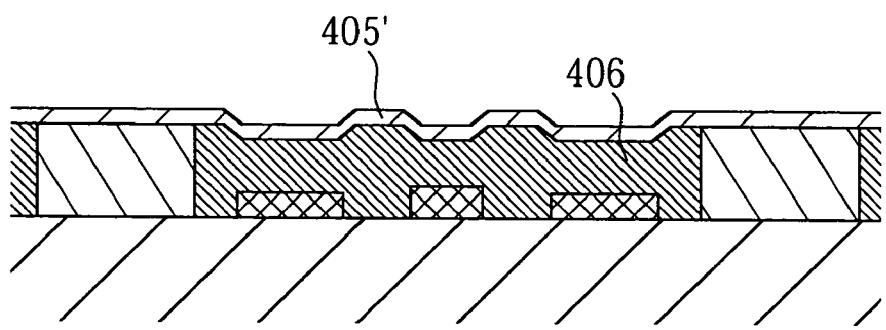
Figure 27C:
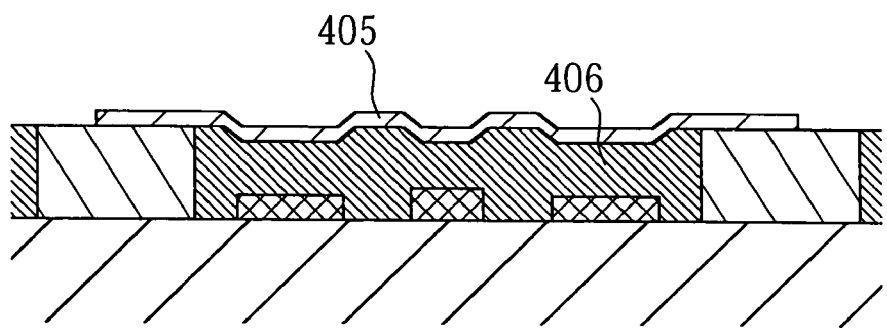
Figure 27D:
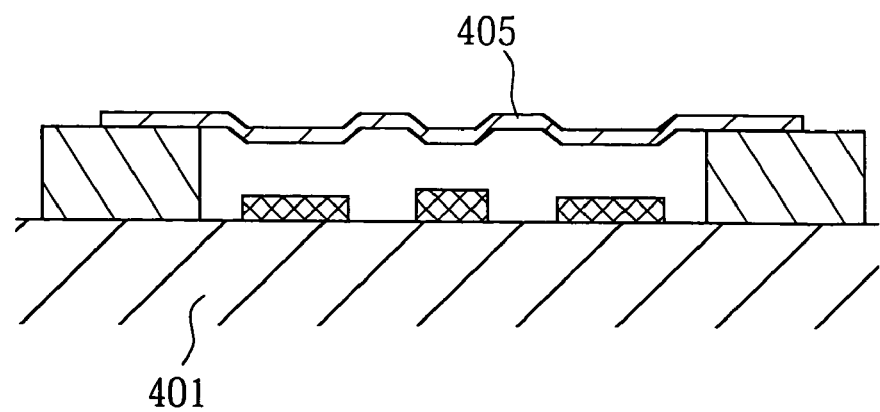

Then, as shown in FIG. 19C, the substrate S3 is subjected to wet etching for reducing the thickness of the substrate down to 100 μm, for example. The etchant may be alkali solution, for example. Then, the cap assembly 200 is formed with holes H by reactive ion etching (RIE). Thereafter, referring to FIG. 19D, bumps 45A-45C are formed in the relevant holes H.

The micro-switching element X2 can be produced in the manner described above. In the above method, there is no need to perform a step for pattering a pair of spacers 60 on the substrate before the sacrifice layer 60' is formed. In addition, there is no need to perform a step for patterning the sacrifice layer 60' before the membrane 51 of the movable beam is formed on the sacrifice layer 60'. According to a method of the present invention, the spacers 60 are formed as remaining portions of the sacrifice layer 60' between the substrate S3 and the membrane 51 as part (most) of the sacrifice layer 60' is removed. Thus, it is possible to efficiently produce the spacers 60. Further, there is no need to produce reinforcing members for the ends of the movable beam 50 nor to grind the sacrifice layer 60'. As a result, the micro-switching element of the present invention can be produced efficiently.

Still further, the method of the present invention can be implemented at reduced cost since no SOI substrate is used.

In the method of making the micro-switching element X2, wafer-level packaging is effectively realized. Hence, the method is advantageous to protecting the movable beam against damage that may otherwise be made at a dicing step for producing individual elements, or at a handling step for moving an element from one place to another, for example.

The present invention being thus described, it is obvious that the same may be varied in many ways. Such variations are not to be regarded as a departure from the spirit and scope of the present invention, and all such modifications as would be obvious to those skilled in the art are intended to be included within the scope of the following claims.

The invention claimed is:

1. A micro-switching element comprising:
a substrate;
a pair of supporting members spaced from each other and fixed to the substrate;
a movable beam that includes a membrane bridging between the supporting members, a movable contact electrode formed on one surface of the membrane directed away from the substrate and a movable driving electrode formed on said one surface of the membrane, the membrane including a pair of enlarged end portions corresponding in position to the pair of supporting members;
a pair of stationary contact electrodes arranged to face the movable contact electrode;
a stationary driving electrode cooperating with the movable driving electrode for generation of electrostatic force,
wherein the supporting members are smaller than the enlarged end portions, respectively, of the membrane both with respect to width and length; and
wherein the membrane is formed with an opening in facing relationship to the stationary contact electrodes, the movable contact electrode extending through and beyond the opening of the membrane to project toward the stationary contact electrodes.

2. A micro-switching element comprising:

a substrate;

a pair of supporting members spaced from each other and fixed to the substrate;

a movable beam that includes a membrane bridging between the supporting members, a movable contact electrode on the membrane and a movable driving electrode on the membrane, the membrane including a pair of enlarged end portions corresponding in position to the pair of supporting members;

a pair of stationary contact electrodes arranged to face the movable contact electrode; and a stationary driving electrode cooperating with the movable driving electrode for generation of electrostatic force, wherein the supporting members are entirely concealed behind the enlarged end portions of the membrane; and wherein the membrane includes a main portion extending between the pair of enlarged end portions, the main portion of the membrane being formed with a plurality of openings, the movable contact electrode bing formed with a plurality of openings that communicate with selected ones of the openings of the membrane, the movable driving electrode being also formed with a plurality of openings that communicate with other ones of the openings of the membrane.

3. The micro-switching element according to claim 2, wherein the supporting members are made of silicon, the membrane being made of silicon dioxide or silicon nitride.

4. The micro-switching element according to claim 2, wherein the supporting members are made of silicon dioxide, the membrane being made of silicon.

5. The micro-switching element according to claim 2, wherein the membrane has a thickness no smaller than 1.5 μm.

6. The micro-switching element according to claim 2, wherein the movable contact electrode and the movable driving electrode are formed on a surface of the membrane facing away from the substrate, the movable contact electrode including downward projections penetrating through the membrane for contact with the stationary contact electrodes.

* * * * *